(12) United States Patent
Waheed et al.

(10) Patent No.: US 7,817,747 B2
(45) Date of Patent: Oct. 19, 2010

(54) PRECISE DELAY ALIGNMENT BETWEEN AMPLITUDE AND PHASE/FREQUENCY MODULATION PATHS IN A DIGITAL POLAR TRANSMITTER

(75) Inventors: Khurram Waheed, Acton, MA (US); Jayawardan Janardhanan, Bangalore (IN); Sameh S. Rezeq, Dallas, TX (US); Robert B. Staszewski, Delft (NL); Saket Jalan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 875 days.

(21) Appl. No.: 11/675,565

(22) Filed: Feb. 15, 2007

(65) Prior Publication Data

US 2007/0189417 A1 Aug. 16, 2007

Related U.S. Application Data

(60) Provisional application No. 60/773,759, filed on Feb. 15, 2006.

(51) Int. Cl.
*H04L 27/36* (2006.01)
(52) U.S. Cl. .................................. 375/298; 375/371
(58) Field of Classification Search ................. 375/298, 375/300, 302, 308, 371
See application file for complete search history.

(56) References Cited

U.S. PATENT DOCUMENTS

| | | | |
|---|---|---|---|
| 6,809,598 B1 | 10/2004 | Staszewski et al. ........... 331/16 |
| 2005/0287967 A1 | 12/2005 | Hung et al. ............... 455/127.2 |
| 2006/0033582 A1 | 2/2006 | Staszewski et al. ........... 331/16 |
| 2006/0038710 A1 | 2/2006 | Staszewski et al. ......... 341/143 |
| 2006/0246856 A1* | 11/2006 | Udagawa et al. ............ 455/108 |

OTHER PUBLICATIONS

R. B. Staszewski, D. Leipold, C. M. Hung, and P. T. Balsara, "A first digitally-controlled oscillator in a deep-submicron CMOS process for multi-GHz wireless applications," Proc. of 2003 IEEE Radio Frequency Integrated Circuits (RFIC) Symp., sec. MO4B-2, pp. 81-84, Jun. 2003.

(Continued)

*Primary Examiner*—David B Lugo
(74) *Attorney, Agent, or Firm*—Ronald O. Neerings; Wade James Brady, III; Frederick J. Telecky, Jr.

(57) ABSTRACT

A novel apparatus for and method of delay alignment between amplitude and phase/frequency modulation paths in a digital polar transmitter. The invention provides a fully digital delay alignment mechanism where better than nanosecond alignment is achieved by accounting for processing delays in the digital circuit modules of the transmitter and by the use of programmable delay elements spread across several clock domains. Tapped delay lines compensate for propagation and settling delays in analog elements such as the DCO, dividers, quad switch, buffers, level shifters and digital pre-power amplifier (DPA). A signal correlative mechanism is provided whereby data from the amplitude and phase/frequency modulation paths to be matched is first interpolated and then cross-correlated to achieve accuracy better than the clock domain of comparison. Within the ADPLL portion of the transmitter, precise alignment of reference and direct point injection points in the ADPLL is provded using multiple clock domains, tapped delay lines and clock adjustment circuits.

22 Claims, 22 Drawing Sheets

OTHER PUBLICATIONS

R. B. Staszewski, D. Leipold, K Muhammad, and P. T. Balsara, "Digitally controlled oscillator (DCO)-based architecture for RF frequency synthesis in a deepsubmicrometer CMOS process," IEEE Trans. On Circuits and Systems II, vol. 50, No. 11, pp. 815-828, Nov. 2003.

R. B. Staszewski, K. Muhammad, D. Leipold, et. al., "All-digital TX frequency synthesizer and discrete-time receiver for Bluetooth radio in 130-nm CMOS," IEEE Journal of Solid-State Circuits, vol. 39, iss. 12, pp. 2278-2291, Dec. 2004.

S. R. Norsworthy, D. A. Rich, and T. R. Viswanathan, "A minimal multibit digital noise shaping architecture," Proc. of 1996 IEEE Intl. Symp. on Circuits and Systems, pp. 5-8, 1996.

T. Sowlati, D. Rozenblit, R. Pullela, M. Damgaard, E. McCarthy, D. Koh, D. Ripley, F. Balteanu, and I. Gheorghe, "Quad-Band GSM/GPRS/EDGE Polar Loop Transmitter," IEEE Journal of Solid- State Circuits, vol. 39, pp. 2179-2189, Dec. 2004.

M. R. Elliott, T. Montalvo, B. P. Jeffries, F. Murden, J. Strange, A. Hill, S. Nandipaku, and J. Harrebek, "A Polar Modulator Transmitter for SM/EDGE," IEEE Journal of Solid-State Circuits, vol. 39, pp. 2190-2199, Dec. 2004.

P. Cruise, C. M. Hung and R. B. Staszewski et. al., "A Digital-to-RF Amplitude Converter for GSM/GPRS/EDGE in 90 nm Digital CMOS", Radio Frequency Integrated Circuits Symposium (RFIC) 2005, pp. 21-24.

* cited by examiner

PRECISE DELAY ALIGNMENT BETWEEN AMPLITUDE AND PHASE/FREQUENCY MODULATION PATHS IN A DIGITAL POLAR TRANSMITTER

REFERENCE TO PRIORITY APPLICATION

This application claims priority to U.S. Provisional Application Ser. No. 60/773,759, filed Feb. 15, 2006, entitled "Scheme To Achieve Precise Delay Alignment Between Amplitude And Phase/Frequency Modulation Paths In Digital Polar Transmitters And For Closed Loop Two-Point Modulation At Different Injection Rates In ADPLL", incorporated herein by reference in its entirety.

FIELD OF THE INVENTION

The present invention relates to the field of data communications and more particularly relates to an apparatus for and method of delay alignment between amplitude and phase/frequency modulation paths in a digital polar transmitter.

BACKGROUND OF THE INVENTION

Modern complex envelope modulation schemes such as Enhanced Data rates for GSM Evolution (EDGE), Wideband Code Division Multiple Access (WCDMA), Bluetooth Enhanced Data Rate (BT-EDR), Wireless Local Area Network (WLAN), Worldwide Interoperability for Microwave Access (WiMAX), etc. impose strict performance requirements on transceivers developed to support them, especially wireless handset transmitters. Stringent performance requirements for many aspects of polar transmitters exist as well. A circuit diagram illustrating an example prior art polar transmitter employing complex modulation based on direct phase and amplitude modulation is shown in FIG. 1. The circuit, generally referenced 10, comprises a coder 12, I and Q TX filters 14, 16, polar coordinate converter 18, local oscillator 20 and multiplier 22.

In operation, the bits $b_k$ to be transmitted are input to the coder, which functions to generate I (real) and Q (imaginary) symbols therefrom according to the targeted communications standard. The I and Q symbols are pulse-shaped and the resulting baseband signals are converted to phase (Ang$\{s(t)\}$), and magnitude (Mag$\{s(t)\}$) baseband signals by the polar coordinate converter 18. The phase data is used to control the local oscillator 20 to generate the appropriate frequency signal, which is multiplied in multiplier/mixer 22 by the magnitude data resulting in the output RF signal x(t). It is noted that this polar modulation scheme is better suited for digital implementation rather than analog implementation.

For digital polar transmitters, typical stringent performance requirements exist for modulated close-in and far-out spectra, adjacent channel power ratio (ACPR), adjacent channel leakage ratio (ACLR), error vector magnitude (EVM), phase trajectory error (PTE) and percentage power in-band. Implementation of such modern communication standards using the digital polar modulation approach is possible only if precise alignment can be maintained between the amplitude modulation (AM) and phase/frequency modulation (PM/FM) paths. This is an arduous task as both amplitude and phase (or frequency) paths comprise digital components that need to operate on coarser clock domains (i.e. clocks with time period>10 ns) for power efficiency, while complying with the stringent performance requirements of modern wireless standards. In addition, the front end circuit comprises digitally controlled analog components, such as the digitally controlled oscillator (DCO) (part of the local oscillator 20) and a digitally controlled pre-power amplifier (DPA) (part of the multiplier/mixer 22) which transforms the digital signals to the continuous-time domain with high precision.

In particular, for GSM/EDGE modulations the AM/PM alignment needs to be better than 10 nanoseconds, otherwise a degradation in the transmitter performance occurs. For WCDMA and the 4G modulations, however, the AM/PM alignment needs to be better than a nanosecond to prevent degradation in transmitter performance.

Furthermore, direct two-point modulation in a closed loop ADPLL requires modulation signals to be properly cancelled from the loop in order for the PLL to achieve optimum phase noise performance. The phase modulation accuracy requirement for modern wireless communication standards requires the direct point modulation to be at a faster rate than the reference signal typically used for reference point injection. Both these injection points need to be precisely aligned to achieve desired ADPLL operation.

The problem of time alignment described above can be generalized to any system wherein a signal is split into multiple independent paths and subsequently recombined again to reconstruct the original, but frequency translated, signal. Here to, implementation of such a system is possible only if precise alignment can be maintained between the independent signal paths. In order to produce the exact signal after all the independent paths are recombined, each and every signal path must have the exact amount of delay, otherwise the results will be distorted.

Therefore, in general, there is a need for a mechanism capable of providing precise timing alignment for a signal that has been split into multiple independent paths. In the specific case of a polar transmitter, the mechanism should be able to provide precise timing alignment for the AM and PM/FM modulation paths in a digital polar transmitter.

SUMMARY OF THE INVENTION

The present invention is a novel apparatus and method of delay alignment between amplitude and phase/frequency modulation paths in a digital polar transmitter. The invention provides a fully digital delay alignment mechanism where better than nanosecond alignment is achieved by accounting for processing delays in the various digital circuit modules of the transmitter and by the use of programmable delay elements spread across several clock domains.

Further, the invention provides a mechanism of clock hand-off between different clock domains that preserves the existing alignment between the amplitude and phase/frequency modulation paths. In addition, the final digital stages of both AM and PM/FM paths share a common clock domain source for the high speed clock used in delta-sigma modulators and integer/fraction delay matching in each path. This enables clock domain alignment to be achieved between the two modulation paths.

In addition, the propagation and settling delays in various analog elements including DCO, dividers, quad switch, buffers, level shifters and DPA are compensated for using a tapped delay line (TDL). Each step in the tapped delay line comprises a single buffer delay which can be digitally controlled, thus enabling sub-nanosecond delay alignment between the two paths to be achieved.

To ensure proper delay alignment is achieved, the invention provides a signal correlative mechanism whereby data from the two modulation paths to be matched is first interpolated and then cross-correlated to achieve accuracy better than the clock domain of operation. In particular, high accuracy is critical for the precise alignment of reference and direct point injection points in the ADPLL. Due to the higher phase modulation accuracy requirement for a WCDMA transmitter, the direct point injection operates on a high speed clock while the reference point injection operates on the retimed FREF clock rate (CKR), a much slower clock. The mechanism of the invention provides alignment of these two paths in the CKR (i.e. slow clock) domain. Further, the interpolative correlation technique of the invention enables the precise tuning of high speed clock domain delays in the direct point injection so as to achieve the overall necessary alignment.

The delay alignment scheme comprise fully digital controls, which allow precise, predictable delay settings of the two modulation paths which are independent of any process, voltage and temperature (PVT) variations. Furthermore, the mechanism provides for dynamic calibration of a tapped delay line to account for any variation in the propagation delays in the analog front-end elements of the digital polar transmitter. A calibration mechanism is provided to achieve sub-clock period alignment within the direct and the reference point modulation injection within the ADPLL. In addition, the mechanism is dynamically adapted using any available computing resource (either off or on-chip) such as a script processor in the case of the ADPLL embodiment presented herein.

The delay alignment mechanism of the invention is applicable to any system in which a signal is split into multiple independent paths and subsequently recombined to reconstruct the original signal. In order to produce the exact signal after all the independent paths are recombined, the delays of each and every individual signal path must match, otherwise the results will be distorted. Note that the invention is intended for use in a digital radio transmitter or transceiver but can be used in other applications as well, such as a general communication channel and data converters.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention, a method of time alignment of a signal split into a plurality of independent paths, the method comprising the steps of determining processing delays within one or more modules adapted to process the independent signal paths, generating a plurality of clock domains, using programmable delay elements between the plurality of clock domains to delay one or more clock domains and distributing the plurality of clock domains and the output of the programmable delay elements so as to compensate for the processing delays.

There is also provided in accordance with the present invention, a method of time alignment of a signal split into a plurality of independent paths, the method comprising the steps of determining processing delays within one or more modules adapted to process the independent signal paths, generating a plurality of clock domains, using programmable delay elements between the plurality of clock domains to delay one or more clock domains, distributing the plurality of clock domains and the output of the programmable delay elements so as to compensate for the processing delays and calibrating the time alignment between the independent paths.

There is further provided in accordance with the present invention, a method of delay alignment between amplitude and phase/frequency modulation paths in a digital polar transmitter, the method comprising the steps of dividing a local oscillator clock output into a plurality of clock domains, delaying one or more of the clock domains in time by an amount adapted to compensate for analog propagation and settling times in the amplitude and phase/frequency modulation paths and applying the plurality of clock domains and the one or more delayed clock domains to circuit modules within the amplitude and phase/frequency modulation paths so as to provide time alignment between the amplitude and phase/frequency modulation paths.

There is also provided in accordance with the present invention, an apparatus for providing delay alignment between amplitude and phase/frequency modulation paths in a digital polar transmitter comprising a clock module for dividing a local oscillator clock output into a plurality of clock domains, a tapped delay line operative to delay one or more of the clock domains by a programmable amount adapted to compensate for analog propagation and settling times in the amplitude and phase/frequency modulation paths and means for applying the plurality of clock domains and the one or more delayed clock domains to circuit modules within the amplitude and phase/frequency modulation paths so as to provide time alignment between the amplitude and phase/frequency modulation paths.

There is further provided in accordance with the present invention, an apparatus for providing delay alignment between amplitude and phase/frequency modulation paths in a digital polar transmitter comprising a programmable tapped delay line operative to delay a local oscillator clock in accordance with a delay control signal, a clock module for dividing either the delayed or non delayed local oscillator clock output of the programmable tapped delay line into a plurality of clock domains and means for applying the plurality of clock domains to circuit modules within the amplitude and phase/frequency modulation paths so as to provide time alignment between the amplitude and phase/frequency modulation paths.

There is also provided in accordance with the present invention, an apparatus for providing delay alignment between amplitude and phase/frequency modulation paths in a digital polar transmitter comprising a clock divider module operative to generate a plurality of clock domains derived from the clock output of a digital controlled oscillator (DCO), means for assigning the plurality of clock domains to signal processing blocks within the amplitude and phase/frequency modulation paths, one or more digital delay adjustment modules operative to convert data within the amplitude and phase/frequency modulation paths from one clock domain to another and a tapped delay operative comprising a plurality of buffer delays operative to adjust the phase relationship between high speed clock domains within the amplitude and phase/frequency modulation paths.

There is further provided in accordance with the present invention, a polar transmitter comprising an amplitude modulation path, a phase/frequency modulation path, the phase/frequency modulation path comprising a frequency synthesizer for performing a frequency modulation; the frequency synthesizer comprising a digitally controlled oscillator (DCO), delay alignment means the for providing delay alignment between the amplitude modulation path and the phase/frequency modulation path, the delay alignment means comprising a clock module for dividing a DCO output signal into a plurality of clock domains, a tapped delay line operative to delay one or more of the clock domains by a programmable amount adapted to compensate for analog propagation and settling times in the amplitude and phase/frequency modulation paths and means for applying the plurality of clock domains and the one or more delayed clock domains to circuit modules within the amplitude and phase/frequency modulation paths so as to provide time alignment between the amplitude and phase/frequency modulation paths.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
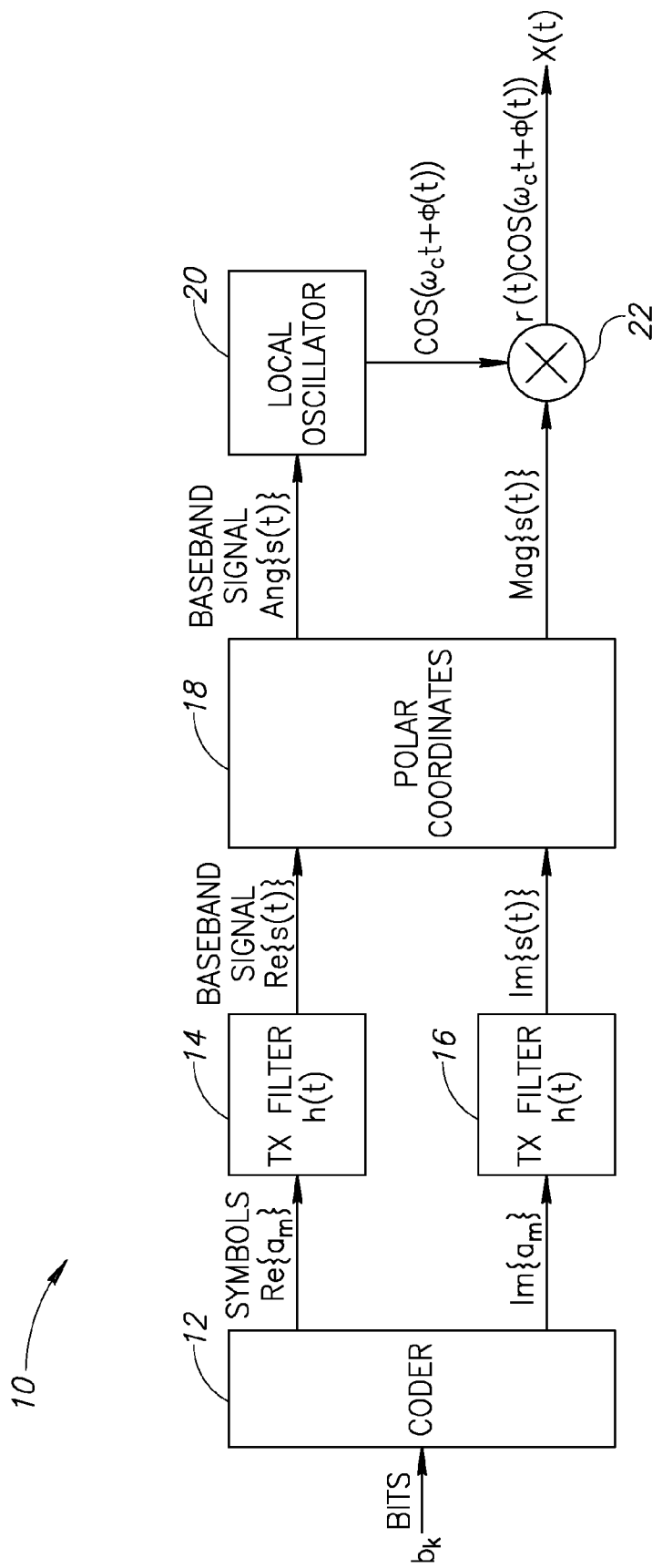
FIG. 1 is a block diagram illustrating a prior art complex polar modulator with direct phase and amplitude modulation.

The following notation is used throughout this document.

| Term | Definition |
| --- | --- |
| ACLR | Adjacent Channel Leakage Ratio |
| ACPR | Adjacent Channel Power Ratio |
| ACW | Amplitude Control Word |
| ADC | Analog to Digital Converter |
| ADPLL | All Digital Phase Locked Loop |
| ARM | Advanced RISC Machine (previously Acorn RISC Machine) |
| ASIC | Application Specific Integrated Circuit |
| BIST | Built-In Self Test |
| BT-EDR | Bluetooth Extended Data Rate |
| CIC | Cascaded Integrator Comb Filter |
| CKR | Retimed Reference Clock |
| CKV | Variable Oscillator Clock |
| CMOS | Complementary Metal Oxide Semiconductor |
| CORDIC | COordinate Rotation DIgital Computer |
| DBB | Digital Baseband |
| DCO | Digitally Controlled Oscillator |
| DCXO | Digitally Controlled Crystal Oscillator |
| DDA | Digital Delay Adjust |
| DEM | Dynamic Element Matching |
| DFC | Digital Frequency Conversion |
| DPA | Digital Power Amplifier |
| DPLL | Digital Phase Locked Loop |
| DRAC | Digital to RF Amplitude Conversion |
| DRP | Digital RF Processor or Digital Radio Processor |
| EDGE | Enhanced Data rates for GSM Evolution |
| EVM | Error Vector Magnitude |
| FCW | Frequency Command Word |
| FM | Frequency Modulation |
| FPGA | Field Programmable Gate Array |
| FREF | Frequency Reference |
| GSM | Global System for Mobile Communications |
| HB | High Band |
| HDL | Hardware Description Language |
| IEEE | Institute of Electrical and Electronic Engineers |
| IPM | Integrated Power Management |
| LB | Low Band |
| LDO | Low Drop Out |
| LUT | Look-Up Table |
| MOS | Metal Oxide Semiconductor |

-continued

| Term | Definition |
| --- | --- |
| OTF | Oscillator Tuning Fractional |
| OTI | Oscillator Tuning Integer |
| OTW | Oscillator Tuning Word |
| PA | Power Amplifier |
| PAR | Peak-To-Average Ratio |
| PLL | Phase Locked Loop |
| PM | Phase Modulation |
| PPA | Pre-Power Amplifier |
| PSF | Pulse-Shaping Filter |
| PTE | Phase Trajectory Error |
| QAM | Quadrature Amplitude Modulation |
| RF | Radio Frequency |
| RFBIST | RF Built-In Self Test |
| RMS | Root Mean Squared |
| SAW | Surface Acoustic Wave |
| SoC | System on Chip |
| SRAM | Static Read Only Memory |
| SRC | Sample Rate Conversion |
| TDC | Time to Digital Converter |
| TDL | Tapped Delay Line |
| VCO | Voltage Controlled Oscillator |
| WCDMA | Wideband Code Division Multiple Access |
| WiMAX | World Interoperability for Microwave Access |
| WLAN | Wireless Local Area Network |

DETAILED DESCRIPTION OF THE INVENTION

The present invention is a novel apparatus for and method of delay alignment between amplitude and phase/frequency modulation paths in a digital polar transmitter. The invention provides a fully digital delay alignment mechanism where better than nanosecond alignment is achieved by accounting for processing delays in the digital circuit modules of the transmitter and by the use of programmable delay elements spread across several clock domains. Tapped delay lines compensate for propagation and settling delays in analog elements such as the DCO, dividers, quad switch, buffers, level shifters and digital pre-power amplifier (DPA). A signal correlative mechanism is provided whereby data from the amplitude and phase/frequency modulation paths to be matched is first interpolated and then cross-correlated to achieve accuracy better than the clock domain of comparison. Within the ADPLL portion of the transmitter, precise alignment of reference and direct point injection points in the ADPLL is provided using multiple clock domains, tapped delay lines and clock adjustment circuits.

The delay alignment mechanism of the invention is applicable to any system in which a signal is split into multiple independent paths and subsequently recombined to reconstruct the original signal. In order to produce the exact signal after all the independent paths are recombined, the delays of each and every individual signal path must match, otherwise the results will be distorted. Note that the invention is intended for use in a digital radio transmitter or transceiver but can be used in other applications as well, such as a general communication channel and data converters.

To aid in understanding the principles of the present invention, the description is provided in the context of a digital RF processor (DRP) based transmitter that may be adapted to comply with a particular wireless communications standard such as GSM, Bluetooth, EDGE, WCDMA, WLAN, WiMax, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulations.

Note that throughout this document, the term communications device is defined as any apparatus or mechanism adapted to transmit, receive or both transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

Figure 2:
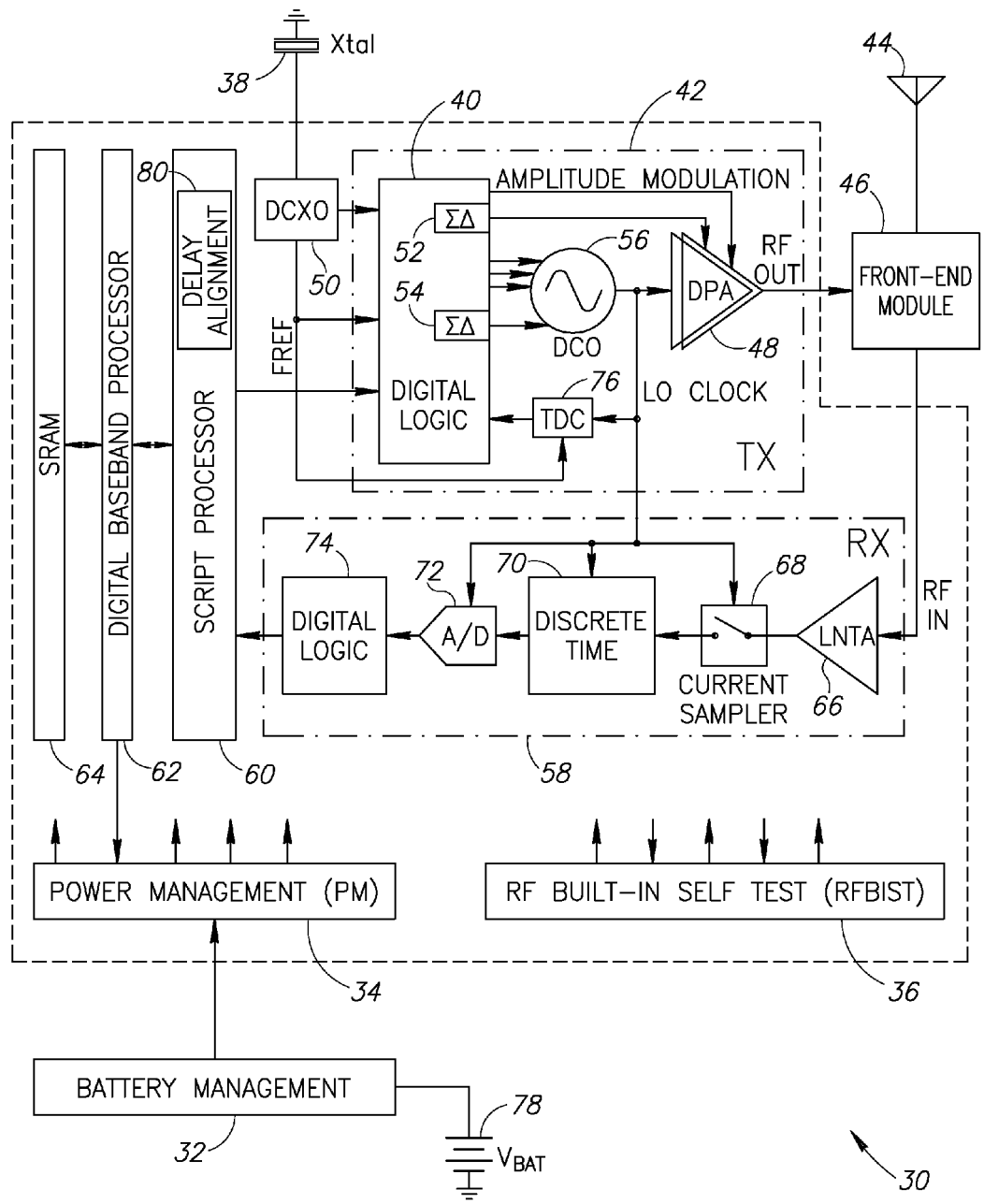
FIG. 2 is a block diagram illustrating a single chip polar transceiver radio incorporating an all-digital local oscillator based transmitter and receiver.

A block diagram illustrating a single chip polar transceiver radio incorporating an all-digital local oscillator based transmitter and receiver is shown in FIG. 2. For illustration purposes only, the transmitter, as shown, is adapted for the GSM/EDGE/WCDMA cellular standards. It is appreciated, however, that one skilled in the communication arts can adapt the transmitter illustrated herein to other modulations and communication standards as well without departing from the spirit and scope of the present invention.

The radio, generally referenced 30, comprises a script processor 60 adapted to execute the delay alignment mechanism of the present invention (represented as task block 80), digital baseband (DBB) processor 62, memory 64 (e.g., static RAM), TX block 42, RX block 58, crystal 38 and digitally controlled crystal oscillator (DCXO) 50, front-end module 46 and antenna 44, power management unit 34, RF built-in self test (BIST) 36, battery 78 and battery management circuit 32. The TX block comprises high speed and low speed digital logic block 40 including $\Sigma\Delta$ modulators 52, 54, digitally controlled oscillator (DCO) 56 and digitally controlled power amplifier (DPA) 48. The RX block comprises a low noise transconductance amplifier 66, current sampler 68, discrete time processing block 70, analog to digital converter (ADC) 72 and digital logic block 74. Note that alternatively, the delay alignment mechanism of the invention can be implemented using dedicated logic.

The principles presented herein have been used to develop three generations of a Digital RF Processor (DRP): single-chip Bluetooth, GSM and GSM/EDGE radios realized in 130 nm, 90 nm and 65 nm digital CMOS process technologies, respectively. The common architecture is highlighted in FIG. 2 with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 56, which avoids any analog tuning controls. A digitally-controlled crystal oscillator (DCXO) generates a high-quality base station-synchronized frequency reference such that the transmitted carrier frequencies and the received symbol rates are accurate to within 0.1 ppm. Fine frequency resolution is achieved through high-speed $\Sigma\Delta$ dithering of its varactors. Digital logic built around the DCO realizes an all-digital PLL (ADPLL) that is used as a local oscillator for both the transmitter and receiver. The polar transmitter architecture utilizes the wideband direct frequency modulation capability of the ADPLL and a digitally controlled power amplifier (DPA) 48 for the amplitude modulation. The DPA operates in near-class-E mode and uses an array of nMOS transistor switches to regulate the RF amplitude. It is followed by a matching network and an external front-end module 46, which comprises a power amplifier (PA), a transmit/receive switch for the common antenna 44 and RX surface acoustic wave (SAW) filters. Fine amplitude resolution is achieved through high-speed ΣΔ dithering of the DPA nMOS transistors.

The receiver 58 employs a discrete-time architecture in which the RF signal is directly sampled at the Nyquist rate of the RF carrier and processed using analog and digital signal processing techniques. The transceiver is integrated with a script processor 60, dedicated digital base band processor 62 (i.e. ARM family processor) and SRAM memory 64. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz digitally controlled crystal oscillator (DCXO) 50. An integrated power management (PM) system is connected to an external battery management circuit 32 that conditions and stabilizes the supply voltage. The PM comprises multiple low drop out (LDO) regulators that provide internal supply voltages and also isolate supply noise between circuits, especially protecting the DCO. The RF built-in self-test (RFBIST) 36 performs autonomous phase noise and modulation distortion testing as well as various loopback configurations for bit-error rate measurements. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

The transmitter comprises a polar architecture in which the amplitude and phase/frequency modulations are implemented in separate paths. Transmitted symbols generated in the digital baseband (DBB) processor are first pulse-shape filtered in the Cartesian coordinate system. The filtered in-phase (I) and quadrature (Q) samples are then converted through a CORDIC algorithm into amplitude and phase samples of the polar coordinate system. The phase is then differentiated to obtain frequency deviation. The polar signals are subsequently conditioned through signal processing to sufficiently increase the sampling rate in order to reduce the quantization noise density and lessen the effects of the modulating spectrum replicas.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," U.S. Patent Publication No. 2006/0038710A1, published Feb. 23, 2006, Staszewski et al., entitled "Hybrid Polar/Cartesian Digital Modulator" and U.S. Pat. No. 6,809,598, to Staszewski et al., entitled "Hybrid Of Predictive And Closed-Loop Phase-Domain Digital PLL Architecture," all of which are incorporated herein by reference in their entirety.

Figure 3:
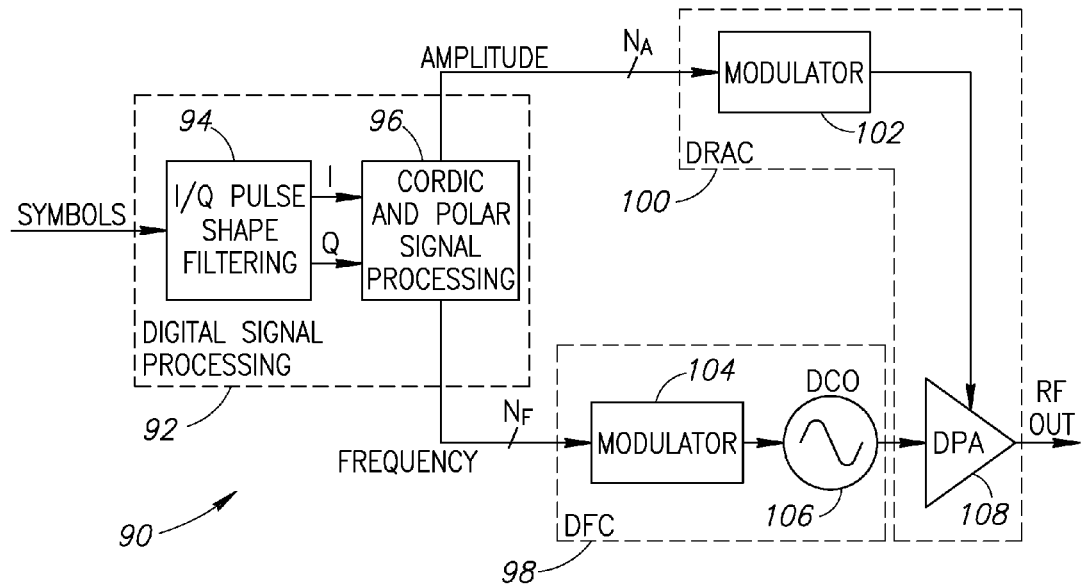
FIG. 3 is a block diagram illustrating a single chip polar transmitter based on a DCO and digitally controlled power amplifier (DPA) circuits.

A block diagram illustrating a single chip polar transmitter based on a DCO and digitally controlled power amplifier (DPA) circuits is shown in FIG. 3. The transmitter, generally referenced 90, comprises a digital signal processor block 92, digital to frequency conversion (DFC) 98 and digital to RF amplitude conversion (DRAC) 100. The DSP block 92 comprises I/Q pulse shaping filtering 94 and CORDIC polar signal processing 96. The DFC comprises a phase/frequency modulator 104 and DCO 106. The DRAC comprises an amplitude modulator 102 and digital power amplifier (DPA) 108.

RF Polar Transmitter in Deep-Submicron CMOS

A paradigm facing analog and RF designers of deep submicron CMOS circuits is that in a deep-submicron CMOS process, time-domain resolution of a digital signal edge transition is superior to voltage resolution of analog signals. A successful design approach in this environment would be to exploit the paradigm by emphasizing (1) fast switching characteristics or high $f_T$ (40 ps and 100 GHz in this process, respectively) of MOS transistors: high-speed clocks and/or fine control of timing transitions; (2) high density of digital logic (e.g., 250 kgates/mm$^2$ in 90 nm process) makes digital functions extremely inexpensive; and (3) small device geometries and precise device matching made possible by the fine lithography, while avoiding (1) biasing currents that are commonly used in analog designs; (2) reliance on voltage resolution; and (3) nonstandard devices that are not needed for memory and digital circuits.

FIG. 3 illustrates an application of the new paradigm to an RF wireless transmitter performing arbitrary quadrature amplitude modulation (QAM). The low cost of digital logic allows for the use of sophisticated digital signal processing techniques. The tiny and well matched devices allow for precise and high-resolution conversions from digital to analog domains. The use of ultra high-speed clocks, i.e. high oversampling ratios, can eliminate the need for subsequent dedicated reconstruction filtering of spectral replicas and switching transients, so that only the natural filtering of an oscillator (1/s due to the frequency-to-phase conversion), matching network of power amplifier and antenna filter are relied upon.

Since the converters utilize DCO clocks that are of high spectral purity, the sampling jitter is very small. The sampling jitter is not significantly affected by modulation, since the jitter due to modulation is not greater than the oscillator thermal jitter. The conversion functions presented herein are phase/frequency and amplitude modulations of an RF carrier realized using digitally-controlled oscillator (DCO) and digitally-controlled power amplifier (DPA) circuits, respectively. They are digitally-intensive equivalents of the conventional voltage-controlled oscillator (VCO) and power amplifier driver circuits.

Due to the fine feature size and high switching speed of modern CMOS technology, the respective digital-to-frequency conversion (DFC) and digital-to-RF-amplitude conversion (DRAC) transfer functions can be made very linear and of high dynamic range. The frequency deviation output signal is fed into the DCO-based $B_F$-bit DFC, which produces the phase modulated (PM) digital carrier:

$$y_{PM}(t) = sgn(\cos(\omega_0 t + \theta[k])) \tag{1}$$

where
  sgn(x)=1 for x≧0;
  sgn(x)=−1 for x<0;
  $\omega_0 = 2\pi f_0$ is the angular RF carrier frequency;
  θ[k] is the modulating baseband phase of the $k^{th}$ sample;
  The phase $$\theta(t) = \int_{-\infty}^{t} f(t)\,dt$$

is an integral of frequency deviation, where $t = k \cdot T_0$ with $T_0$ being the sampling period represented in $B_F = I_F + F_F$ bits, $I_F$ and $F_F$ being integer and fractional bits respectively.

The amplitude modulation (AM) signal controls the envelope of the phase-modulated carrier by means of the DPA based $B_A$-bit DRAC. Higher-order harmonics of the digital carrier are filtered out by a matching network so that the sgn( ) operator is dropped. The composite DPA output contains the desired RF output spectrum.

$$y_{RF}(t)=a[k]*\cos(\omega_0 t+\theta[k]) \qquad (2)$$

where a[k] is the modulating baseband amplitude of the $k^{th}$ sample. The amplitude is represented in $B_A=I_A+F_A$ bits, $I_A$ and $F_A$ being integer and fractional bits respectively.

Despite their commonalities there are important differences between the two conversion functions. Due to the narrowband nature of the communication system, the DFC operational dynamic range is small but with a fine resolution. On the contrary, the DRAC operating range, on the other hand, is almost full scale, but not as precise. In addition, the phase modulating path features an additional 1/s filtering caused by the frequency-to-phase conversion of the oscillator. The signal processing and delay between the AM and PM paths must be matched, otherwise the recombined composite signal will be distorted. Matching invariability to the process, voltage and temperature (PVT) changes, however, is guaranteed by the clock-cycle accurate characteristics of digital circuits. The group delay of the DCO and DPA circuits is relatively small (e.g., tens of picoseconds due to the high $f_T$ of the deep-submicron CMOS devices) in comparison with the tolerable range (tens of nanoseconds).

The DFC and DRAC are key functions of the all-digital transmitter that does not use any current biasing or dedicated analog continuous-time filtering in the signal path. In order to improve matching, linearity, switching noise and operational speed, the operating conversion cells (i.e. bit to frequency or RF carrier amplitude) are mainly realized as unit weighted. Due to the excellent device matching characteristics in a deep-submicron CMOS process, it is relatively easy to guarantee at least 7-bit conversion resolution in one iteration cycle without resorting to elaborate layout schemes. The DFC and DRAC architectures are presented infra.

Figure 4:
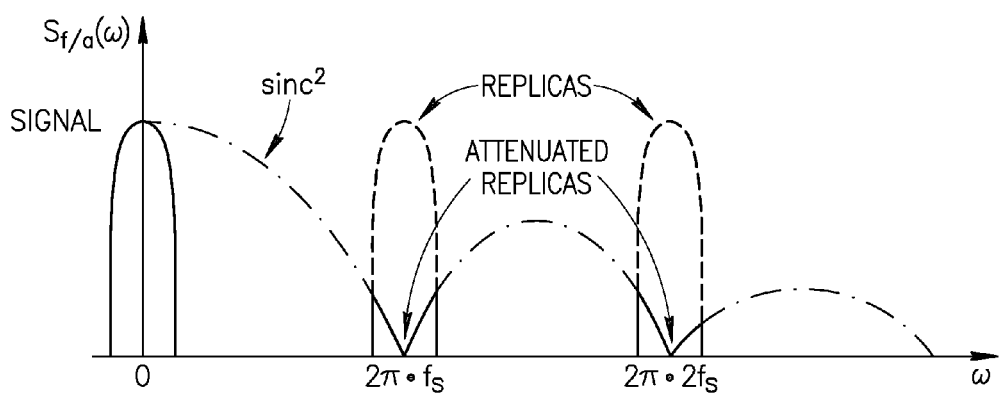
FIG. 4 is a diagram illustrating spectral replicas of a modulating signal and associated filtering through a zero-order hold.

Spectral replicas of the discrete-time modulating signal appear at the DCO and DPA inputs at integer multiples of the sampling rate frequency $f_s$, as shown in FIG. 4. They are attenuated through multiplication of the $\text{sinc}^2$ function due to the zero-order hold of the DCO/DPA input. The frequency spectrum $S_f(\omega)$ replicas are further attenuated by 6 dB/octave through the 1/s operation of the oscillator to finally appear at the RF output phase spectrum $S_\phi(\omega)$. The sampling rate $f_s$ is chosen to be high enough for the replicas to be sufficiently attenuated, thus making the RF signal undistinguishable from that created by the conventional transmitters with continuous-time filtering at baseband.

Amplitude and Phase Modulation

Figure 5:
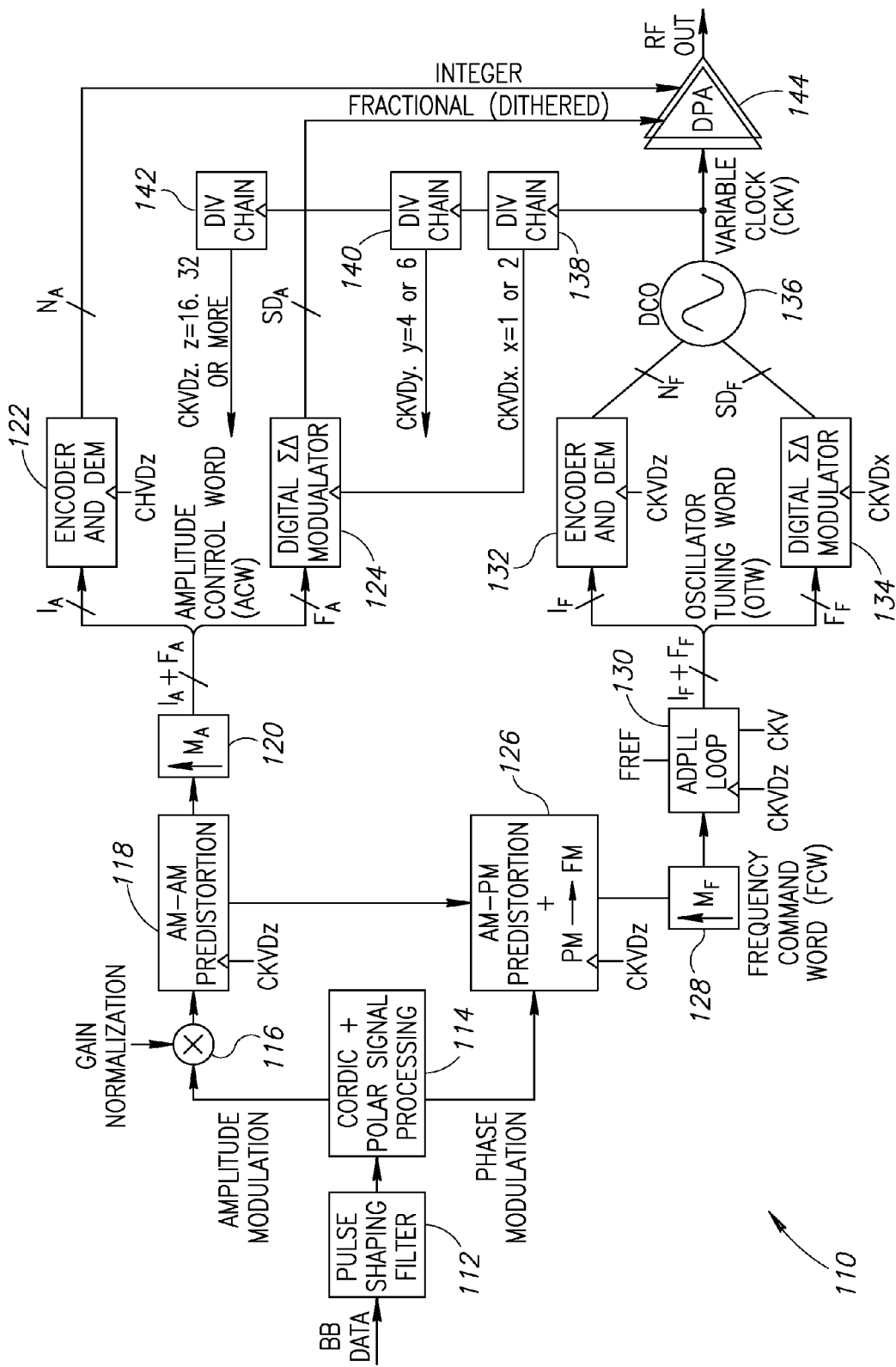
FIG. 5 is a block diagram illustrating the amplitude and phase modulation paths of the polar transmitter.

A block diagram illustrating the amplitude and phase modulation paths of an example polar transmitter is shown in FIG. 5. The polar transmitter, generally referenced 110, comprises a pulse shaping filter 112 and CORDIC 114 which splits the data into amplitude and phase modulation paths. The amplitude modulation path comprises gain normalizer 116, AM-AM predistortion 118, amplitude interpolation 120, encoder and dynamic element matching (DEM) 122, digital ΣΔ modulator 124 and digital power amplifier (DPA) 144. The phase modulation path comprises AM-PM predistortion (as well as conversion to frequency) 126, phase interpolation 128, ADPLL loop 130, encoder and DEM 132, digital ΣΔ modulator 134 and DCO 136.

In accordance with the invention, the transmitter also comprises a clock divider array comprising divider chains 138, 140, 142. Clock divider chain 138 functions to divide the variable clock CKV output of the DCO by 1 or 2 to generate CKVDx, where x=1 or 2. Clock divider chain 140 functions to divide the CKVDx clock by 4 or 8 to generate CKVDy, where y=4 or 8 (or 8 or 16, respectively, if x=2). Clock divider chain 142 functions to divide the CKVDy clock by 4 or 8 to generate CKVDz, where z=16, 32 or higher.

For the polar transmitter 110, the pulse-shaping filter contains separate I and Q filters followed by a CORDIC algorithm to convert the I and Q data to polar-domain phase and amplitude outputs. The pulse shaping sampling rate is typically derived from the reference clock (or the down-divided CKV clock, preferably through a fractional-N division manner), the output of the pulse shaping filter is then interpolated to smoothen both the amplitude and phase modulating signals. The phase output of the CORDIC is adjusted for AM-PM distortions in the DPA and the PA. It is then differentiated to fit the $I_F+F_F$ bits FCW frequency format after interpolation $M_F$ to the DCO direct modulation rate of the ADPLL input. During the modulation stage, the ADPLL drives the DCO varactors with $N_F$ bits integer bits and SDF bit ΣΔ dithered fractional bits.

The amplitude output is scaled for the appropriate power level as well as mapped to the step size of the digitally controlled power amplifier (DPA). The amplitude output then undergoes AM-AM predistortion followed by interpolation MA to the appropriate injection rate for the DPA. The $I_A+F_A$ bit amplitude control word (ACW) is then converted to the $N_A$-bit integer unit-weighted format of the DPA. A dedicated bank of DPA transistors also undergoes a high frequency third-order ΣΔ modulation to enhance the amplitude resolution (by $SD_A$ bits) and to achieve noise spectral shaping. Both the DCO and the DPA controllers also perform dynamic element matching (DEM) to enhance the time-averaged linearity due to possible device mismatch. The above described polar mechanism is employed for complex modulation schemes such as EDGE, WCDMA and others. In the GSM mode operation, however, a single Gaussian pulse shaping filter is used and the CORDIC circuit is bypassed. The AM path is temporarily engaged to ramp the output power to a desired level and then remains fixed throughout the payload.

Critical to achieving satisfactory performance of a polar transmitter is proper delay matching between phase and amplitude modulation signals from the CORDIC input through to the DPA or PA output. Phase modulation is accomplished by injecting the phase information to the ADPLL, while the amplitude signal path is quite different as amplitude information is modified for power control and spectral replica mitigation. In order to reproduce the source I/Q data feeding the CORDIC at the antenna port, the delays in the phase and amplitude paths of the transmitter must be properly matched.

Alignment Accuracy Between Amplitude and Phase Modulation Paths

Beyond the CORDIC, both amplitude and phase modulation paths comprise separate signal processing paths. Desirable transmitter performance characteristics can be achieved only if the two distinct paths are properly tuned and aligned 'perfectly'. For complex modulation schemes that utilize both of these modulation paths in a polar transmitter, mostly symmetric signal processing operations are done at lower clock rates to ensure that the alignment can be maintained between the two paths. For high speed transmitter operations, however, the two paths may experience misalignment due to the need to perform asymmetric operations for accurate amplitude and phase reconstruction. Secondly, even for similar clock rates used in the two paths, the clock tree delays for each path are also independent and thus introduce additional alignment skews. Thirdly, in the digital to analog interfaces, both the amplitude and phase (or frequency) modulation paths involve certain analog delays, which are a function of process, voltage and temperature (PVT).

A confluence of several of these factors necessitate that the alignment requirements for each modulation scheme be analyzed and appropriate design measures taken to ensure that the optimal alignment accuracy is achieved. The timing alignment precision between amplitude and phase paths required for 2.5G EDGE is in the order of a few nanoseconds (i.e. <10 ns). While for WCDMA and 4G modulations, this AM/PM alignment needs to be better than a nanosecond (i.e. <1 ns), otherwise severe degradation in critical transmitter performance parameters occurs. A brief analysis of the alignment accuracy needed for EDGE and WCDMA modulations is presented below.

EDGE Modulation

Time alignment between amplitude and phase in the case of EDGE can be achieved in several stages. A coarse time alignment block is placed after the CORDIC with a resolution of CKVD256 (i.e. CKV divided by 256) where CKV is the channel frequency for high band (HB), and twice the channel frequency for low band (LB). Finer time alignment blocks follow in the Cascaded Integrator Comb (CIC) interpolation block after each interpolator stage. This yields a progressively fine resolution down to CKVDy (CKV divided by y) clock rate, which is the integer data injection rate into the DCO and the DPA. Typically, this alignment is accurate up to a few nanoseconds. Further alignment mechanisms are discussed infra.

Figure 6:
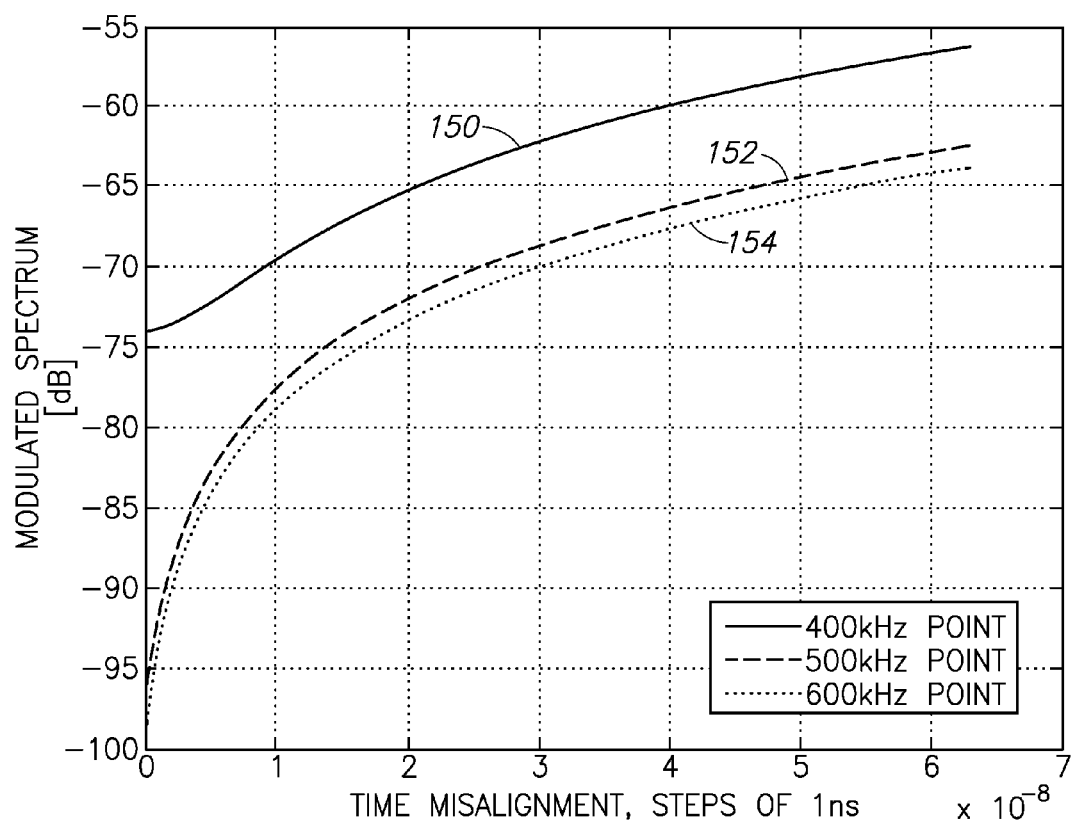
FIG. 6 is a graph illustrating the effect of misalignment between amplitude and phase on several points of the EDGE spectrum.

A graph illustrating the effect of misalignment between amplitude and phase on several points of the EDGE spectrum is shown in FIG. 6. The graph shows the effects of misalignment at 400 kHz (solid trace referenced 150), 500 kHz (dashed trace referenced 152) and 600 kHz (dotted trace referenced 154) points on the close-in EDGE spectrum, averaged over 30 kHz around each point, with time delay between amplitude and phase swept from 0 to 60 ns.

Figure 7:
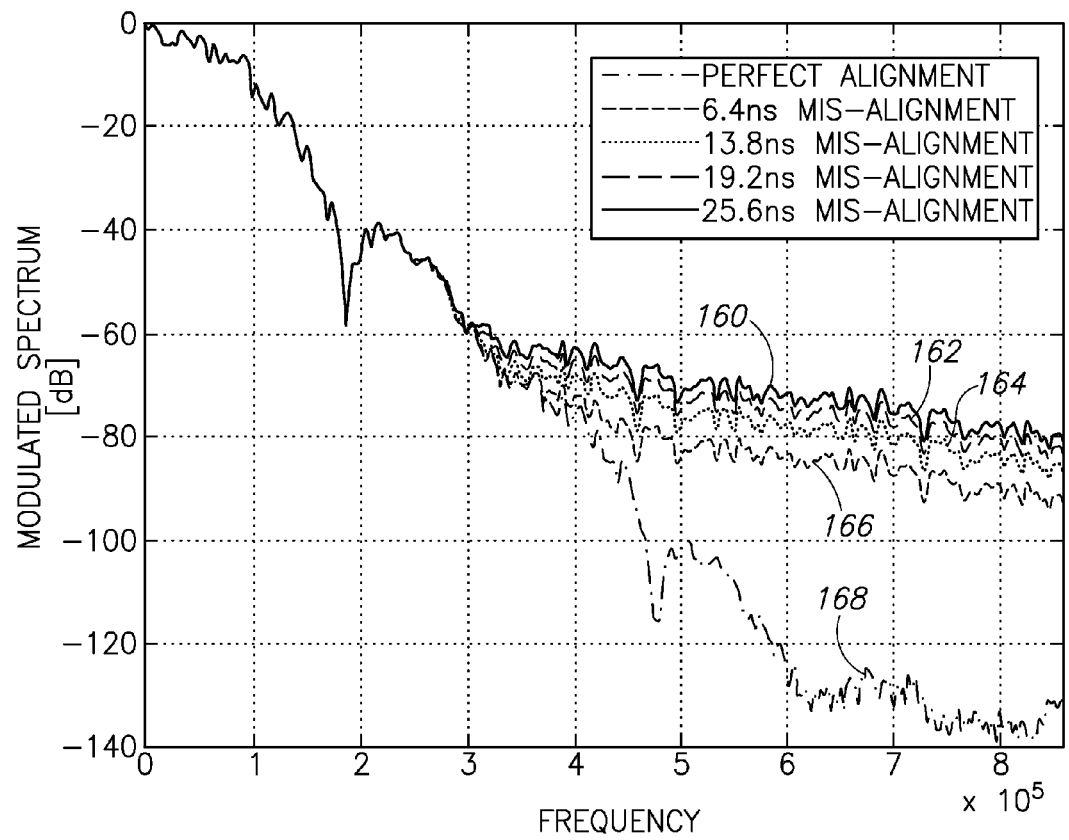
FIG. 7 is a graph illustrating the effect of misalignment between amplitude and phase on the EDGE spectrum for several different time mismatch delays.

A graph illustrating the effect of misalignment between amplitude and phase on the EDGE spectrum for several specific time mismatch delays is shown in FIG. 7. The graph shows several traces wherein trace 160 represents perfect alignment; trace 162 represents 6.4 ns misalignment; trace 164 represents 13.8 ns of misalignment, trace 166 represents 19.2 ns of misalignment and trace 168 represents 25.6 ns of misalignment.

WCDMA Modulation

For WCDMA, the CORDIC typically runs at a rate which is significantly higher than that of an EDGE TX. This is required to preserve the much wider modulation signal bandwidth. This results in much higher frequency excursion (due to possible high speed 180° phase transitions) as well as faster amplitude changes due to a higher peak-to-average ratio (PAR) in WCDMA. This results in increased sensitivity of WCDMA modulation reconstruction to the delay between the amplitude and phase modulation paths. Simulated analysis results for WCDMA are presented hereinbelow.

Figure 8:
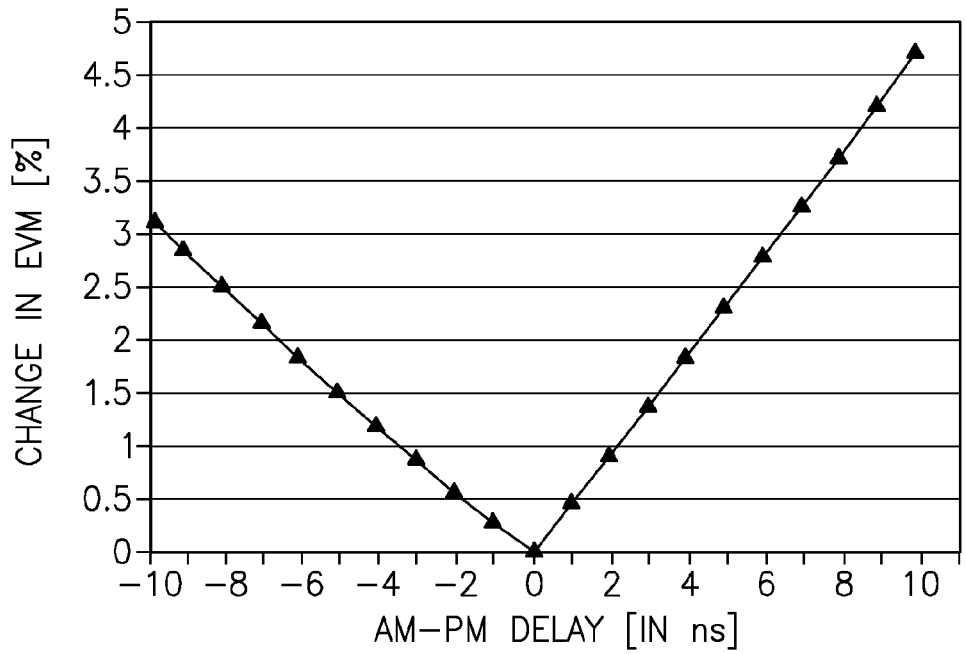
FIG. 8 is a graph illustrating the degradation in EVM for WCDMA as a function of time mismatch between amplitude and phase modulation paths.

A graph illustrating the degradation in error vector magnitude (EVM) for WCDMA as a function of time mismatch between amplitude and phase modulation paths is shown in FIG. 8. The relative change in EVM expressed as a percentage versus the AM-PM delay in nanoseconds is plotted. It is noted that the degradation is not symmetrical for negative and positive delays.

Figure 9:
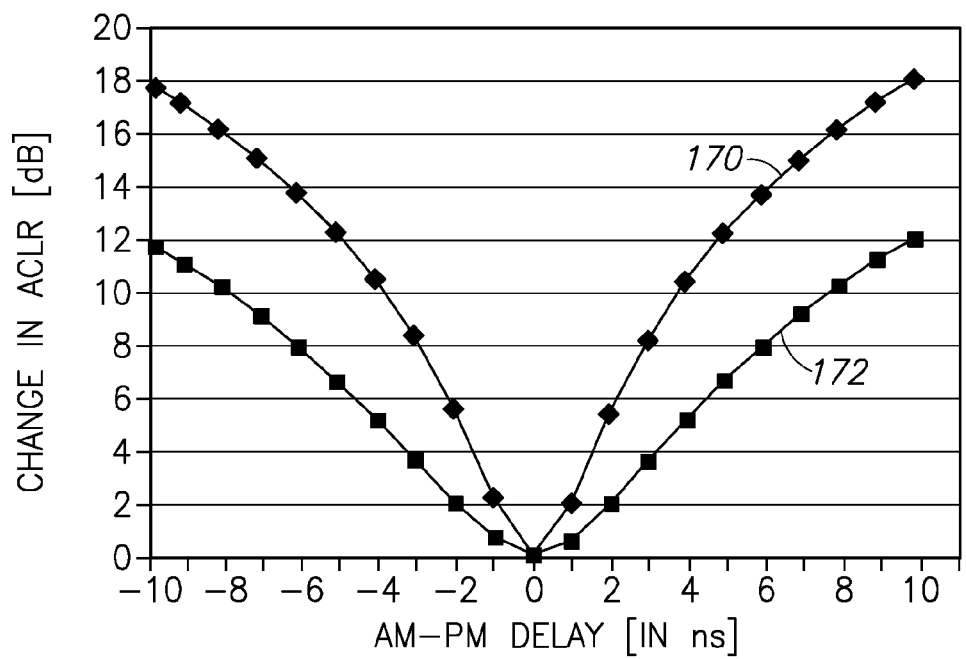
FIG. 9 is a graph illustrating the degradation in ACLR for WCDMA as a function of time mismatch between amplitude and phase modulation paths.

A graph illustrating the degradation in ACLR for WCDMA as a function of time mismatch between amplitude and phase modulation paths is shown in FIG. 9. The relative change in ACLR expressed in dB versus the AM-PM delay in nanoseconds is plotted. The ACLR1 is represented as trace 172 while ACLR2 is represented as trace 170. Unlike the impact in EVM performance, the impact on ACLR performance is symmetrical for positive and negative delays.

Alignment Accuracy Between Integer and Fractional Bits of Phase and Amplitude Modulations The investigation results of the impact of integer and fractional alignment of amplitude and phase modulation paths in a polar transmitter is now presented. Since WCDMA is more sensitive to such artifacts, the results presented hereinbelow are based on WCDMA polar transmitter simulation results. These misalignments may be introduced by the fact that the integer part of each operates at the CKVDy clock rate (see FIG. 5), while the ΣΔ modulators for the fractional representation requires an over-sampling ratio (OSR) and hence uses a much higher rate clock CKVDx.

Alignment Requirement Between Amplitude Integer/Fractional Bits

Figure 10:
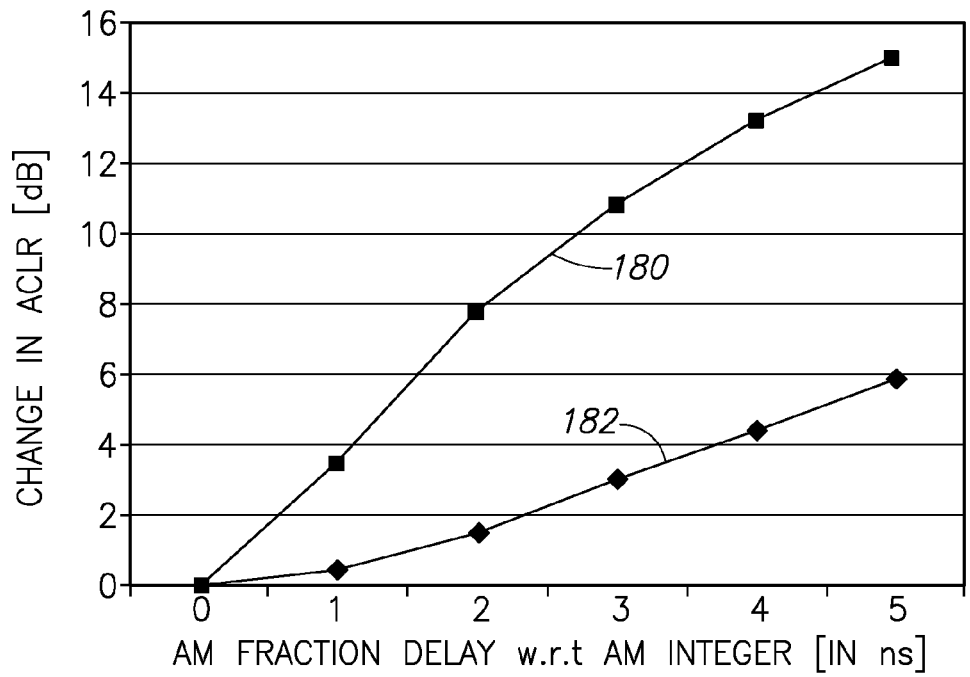
FIG. 10 is a graph illustrating the degradation in ACLR for WCDMA as a function of time mismatch between amplitude integer and fractional bits.

A graph illustrating the degradation in ACLR for WCDMA as a function of time mismatch between amplitude integer and fractional bits is shown in FIG. 10. The relative change in ACLR expressed in dB versus the AM fractional delay with respect to AM integer delay in nanoseconds is plotted. The ACLR1 is represented as trace 182 while ACLR2 is represented as trace 180.

Figure 11:
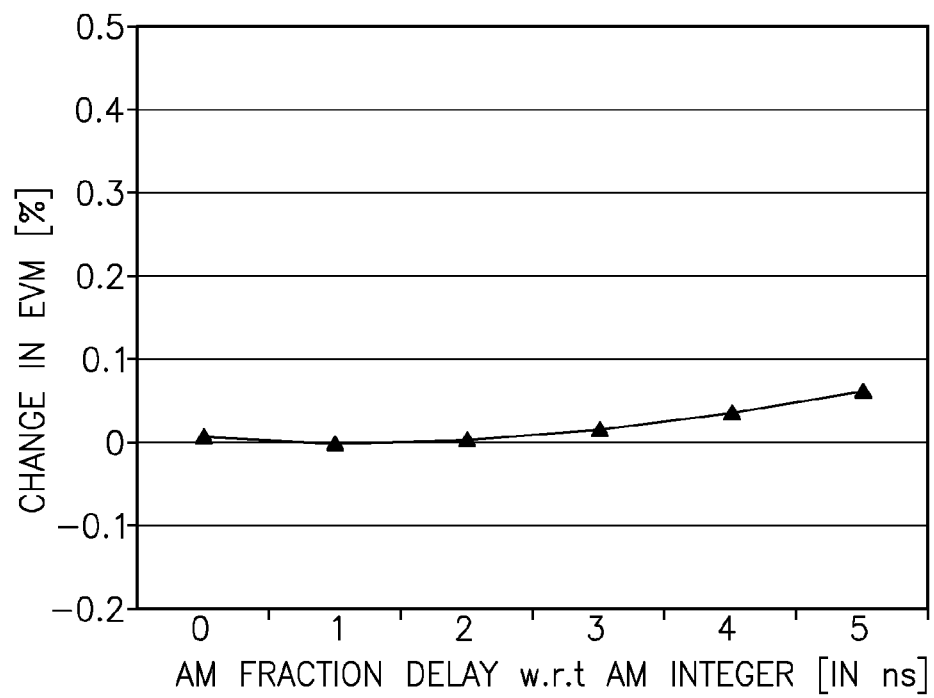
FIG. 11 is a graph illustrating the degradation in EVM for WCDMA as a function of time mismatch between amplitude integer and fractional bits.

A graph illustrating the degradation in EVM for WCDMA as a function of time mismatch between amplitude integer and fractional bits is shown in FIG. 11. The relative change in EVM expressed as a percentage versus the AM fractional delay with respect to AM integer delay in nanoseconds is plotted.

It is observed that the amplitude integer and fractional bit misalignment causes spectral re-growth which results in a degradation of the adjacent channel leakage, as shown in FIG. 10. As shown in FIG. 11, however, WCDMA TX EVM is not very sensitive to the amplitude integer/fraction timing mismatch. The ACLR degradation indicates that the nanosecond alignment accuracy is needed for good transmitter performance parameters.

Alignment Requirement Between Phase Integer/Fractional Bits

Figure 12:
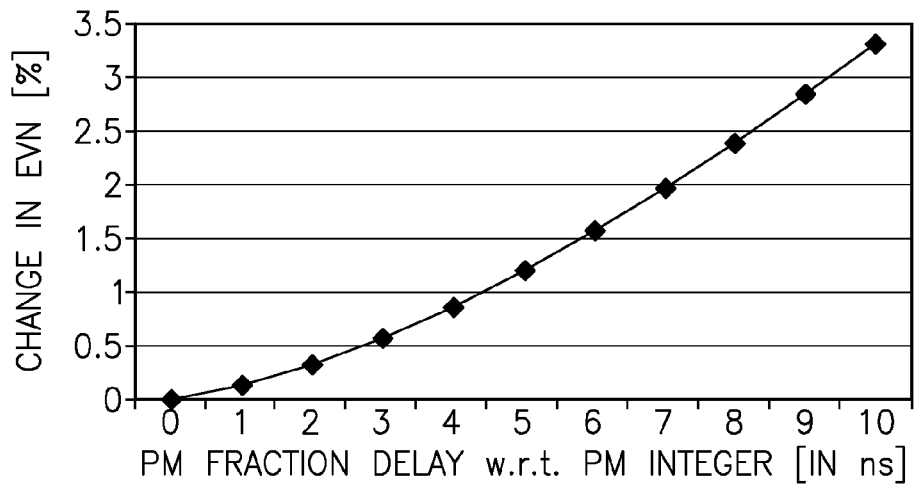
FIG. 12 is a graph illustrating the degradation in EVM for WCDMA as a function of time mismatch between phase integer and fractional bits.

A graph illustrating the degradation in EVM for WCDMA as a function of time mismatch between phase integer and fractional bits is shown in FIG. 12. The relative change in EVM expressed as a percentage versus the PM fractional delay with respect to PM integer delay in nanoseconds is plotted.

Figure 13:
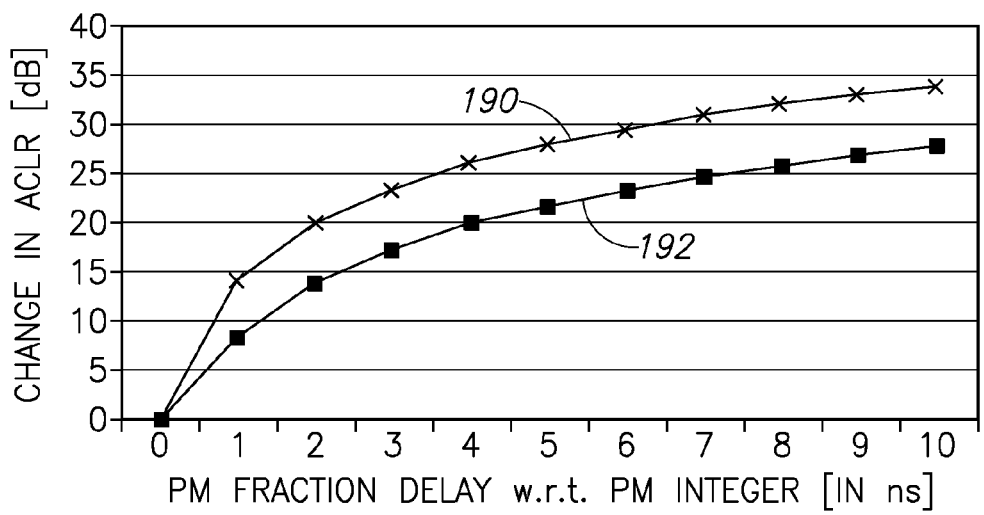
FIG. 13 is a graph illustrating the degradation in ACLR for WCDMA as a function of time mismatch between phase integer and fractional bits.

A graph illustrating the degradation in ACLR for WCDMA as a function of time mismatch between phase integer and fractional bits is shown in FIG. 13. The relative change in ACLR expressed in dB versus the PM fractional delay with respect to PM integer delay in nanoseconds is plotted. The ACLR1 is represented as trace 192 while ACLR2 is represented as trace 190.

Figure 14:
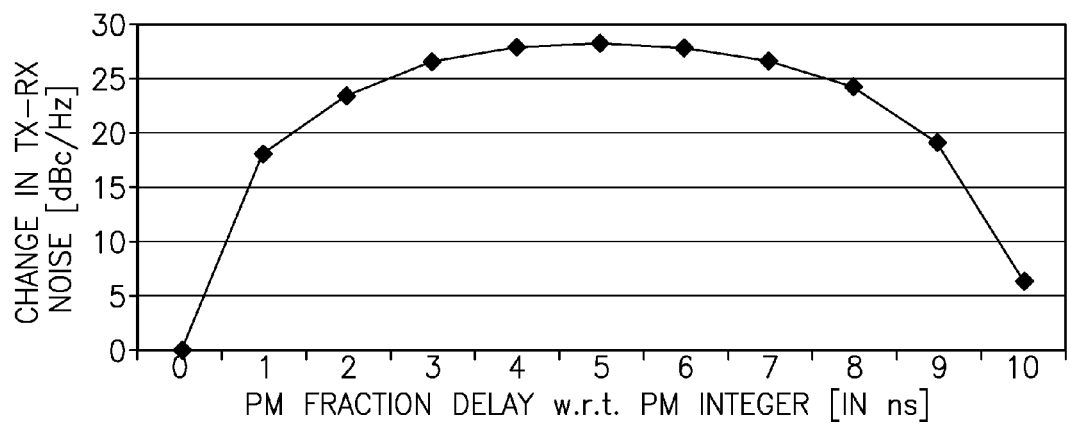
FIG. 14 is a graph illustrating TX spectral noise contribution degradation in the corresponding RX band for WCDMA as a function of time mismatch between phase integer and fractional bits.

A graph illustrating TX spectral noise degradation in the corresponding RX band for WCDMA as a function of time mismatch between phase integer and fractional bits is shown in FIG. 14. The change in TX contributed noise in RX band expressed in dBc/Hz versus the PM fractional delay with respect to PM integer delay in nanoseconds is plotted.

It is observed that WCDMA transmitter performance is quite sensitive to the integer/fraction timing mismatch. Such a misalignment has a direct impact on the modulated phase noise of the DCO. This severely degrades the WCDMA spectrum. The impact on EVM, ACLR(s) and TX-to-RX noise is as shown in FIGS. 12, 13 and 14, respectively. The sharp degradation in the ACLR(s) and TX noise contribution in the RX band warrants that a precise time alignment for the phase integer and fractional bits is required for proper WCDMA transmit operation.

Mechanism to Achieve Sub-Nanosecond Amplitude and Phase Modulation Path Alignment The delay alignment mechanism of the invention of achieving sub-nanosecond time alignment between the amplitude and phase modulation paths in a polar transmitter for 2G/2.5G/3G and beyond will now be described in more detail. It is appreciate that the mechanism described hereinbelow is applicable to any signal that has been split into multiple independent paths and subsequently recombined again to reconstruct the original signal. In order to reproduce the exact signal when all the independent paths are recombined, each and every signal path needs to be delay aligned (i.e. each path must have the same exact amount of delay before recombination), otherwise the end results are likely to be distorted.

The mechanism comprises both circuit construction elements and a calibration procedure to achieve the desired goal of sub-nanosecond delay. In contrast to analog centric approaches applicable to conventional analog I/Q transmitters, where the processing delay per element is relatively small but the delay alignment varies significantly over process, voltage and temperature, for DRP based transmitters as presented herein, the delay alignment mechanism of the invention provides fully-digital control with precisely known and predictable delay settings of amplitude and phase/frequency modulation paths. Furthermore, the mechanism is amenable to dynamic calibration using either a script processor 60 (FIG. 2) or any other on or off-chip computational resource.

Using the mechanism of the invention, better than a nanosecond alignment accuracy is achieved by accounting for processing delays in different digital modules and by the addition of programmable delay elements across several clock domains, namely CKVDz, CKVDy, CKVDx, and CKR (retimed reference), as described in more detail infra. Furthermore, the mechanism insures clock hand-offs between different clock domains preserve the existing alignment between the amplitude and phase/frequency modulation paths.

Multiple Clock Domain Delay Alignment Scheme

Figure 15:
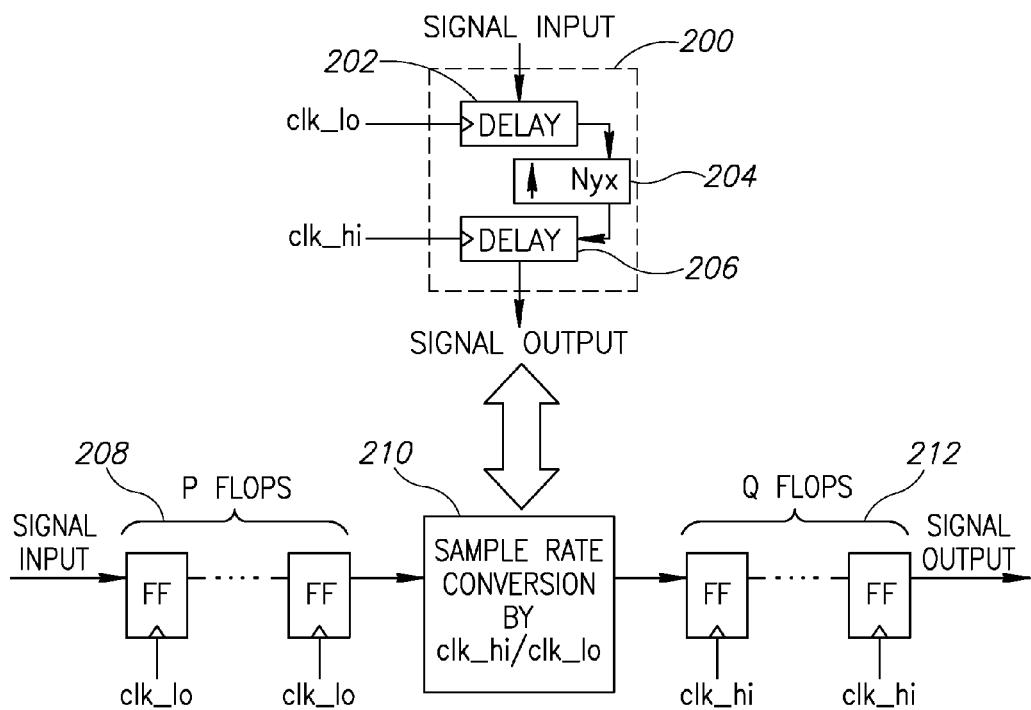
FIG. 15 is a block diagram illustrating a digital delay adjustment block in accordance with the present invention for a signal propagating from a slow clock domain to a fast clock domain.

A block diagram illustrating a digital delay adjustment block in accordance with the present invention for a signal propagating from a slow clock domain to a fast clock domain is shown in FIG. 15. The digital delay adjustment block, generally referenced 200, comprises a delay 202 clocked by a low (slow) clock signal clk_lo adapted to receive the input signal, sample rate converter 204 and delay 206 clocked by a high (fast) clock signal clk_hi. The equivalent circuit is shown below the double arrow and comprises a plurality of P flip-flops 208 clocked by the slow clock clk_lo, sample rate conversion (SRC) 210 (i.e. interpolator) adapted to perform interpolation and convert from the high (fast) clock domain to the low (slow) clock domain and a plurality of Q flip-flops 212 clocked by the fast clock clk_hi.

The digital delay adjustment block 200 enables the use of two different clock domains in controlling the delay in a signal path. Note that these two clocks may or may not be derived from a single master clock source.

Figure 16:
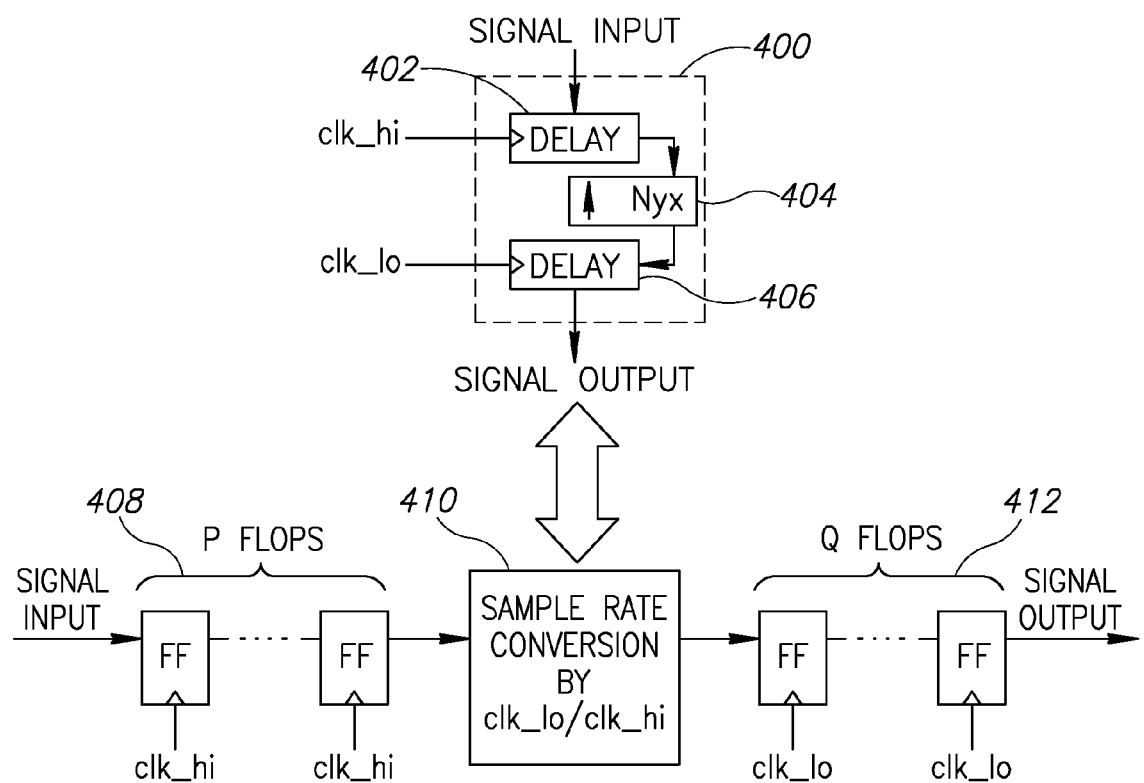
FIG. 16 is a block diagram illustrating a digital delay adjustment block in accordance with the present invention for a signal propagating from a fast clock domain to a slow clock domain.

A block diagram illustrating a digital delay adjustment block in accordance with the present invention for a signal propagating from a fast clock domain to a slow clock domain is shown in FIG. 16. The digital delay adjustment block, generally referenced 400, comprises a delay 402 clocked by a high (fast) clock signal clk_hi adapted to receive the input signal, sample rate converter 404 (i.e. interpolator) and delay 406 clocked by a low (slow) clock signal clk_lo. The equivalent circuit is shown below the double arrow and comprises a plurality of P flip-flops 408 clocked by the fast clock clk_hi, sample rate converter (SRC) 410 adapted to convert from the low (slow) clock domain to the high (fast) clock domain and a plurality of Q flip-flops 412 clocked by the slow clock clk_lo.

The sample rate conversion technique used between the flops placed in the two clock domains can be chosen as per the spectral and signal integrity needs of the signal path. SRC may use simple zero-order hold, linear or second order interpolation or third order Lagrange (or cubic-spline) interpolation/decimation schemes as needed. However note that in case the clk_hi and clk_lo clocks are completely asynchronous to each other, the accuracy of sample rate conversion will be a limited by the accuracy with which the phase and edge timing relationships between the two clock domains can be determined.

Figure 17A:
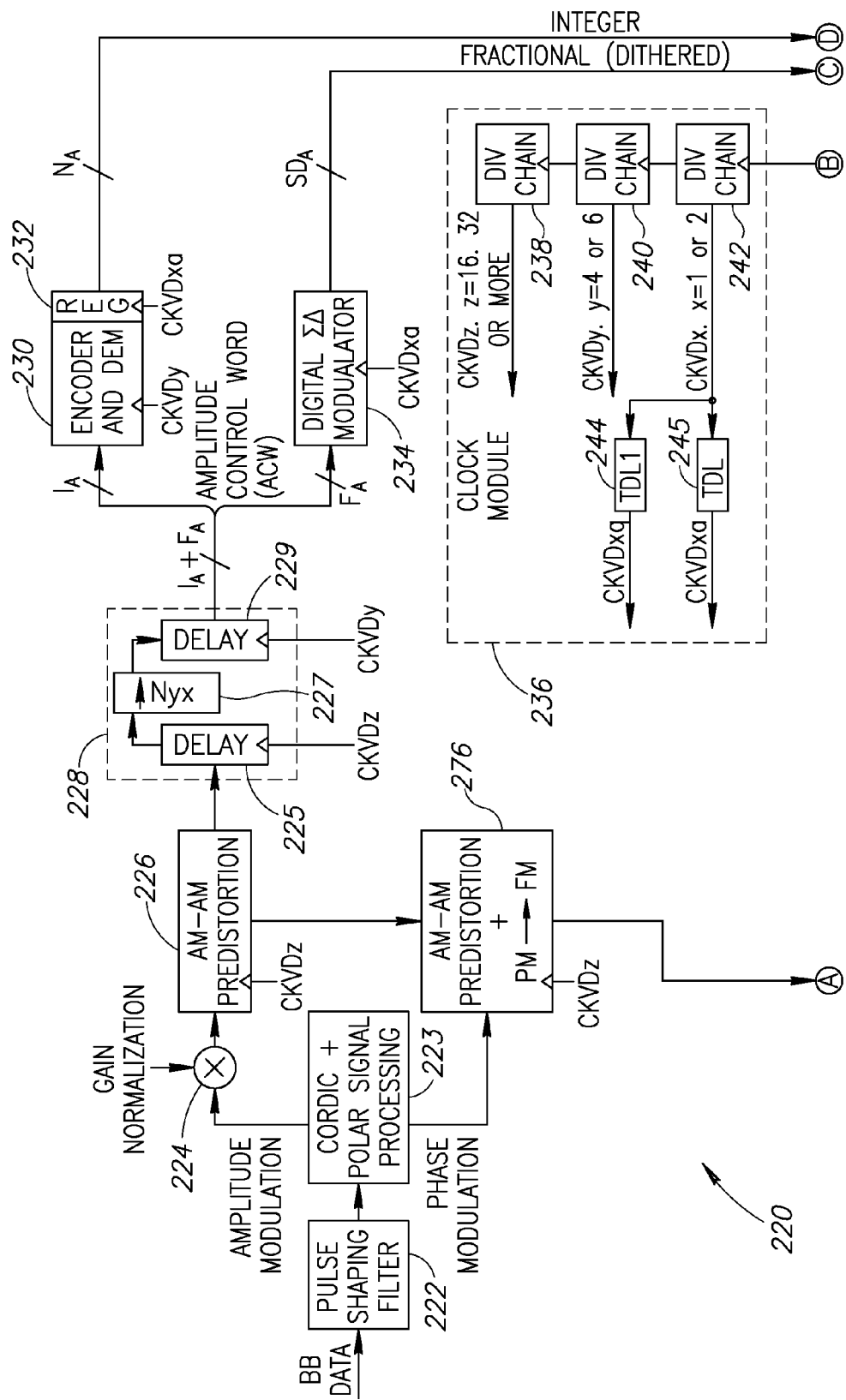
FIG. 17 is a block diagram illustrating a first embodiment of a WCDMA transmitter having precise delay alignment between amplitude and frequency modulation paths.
Figure 17B:
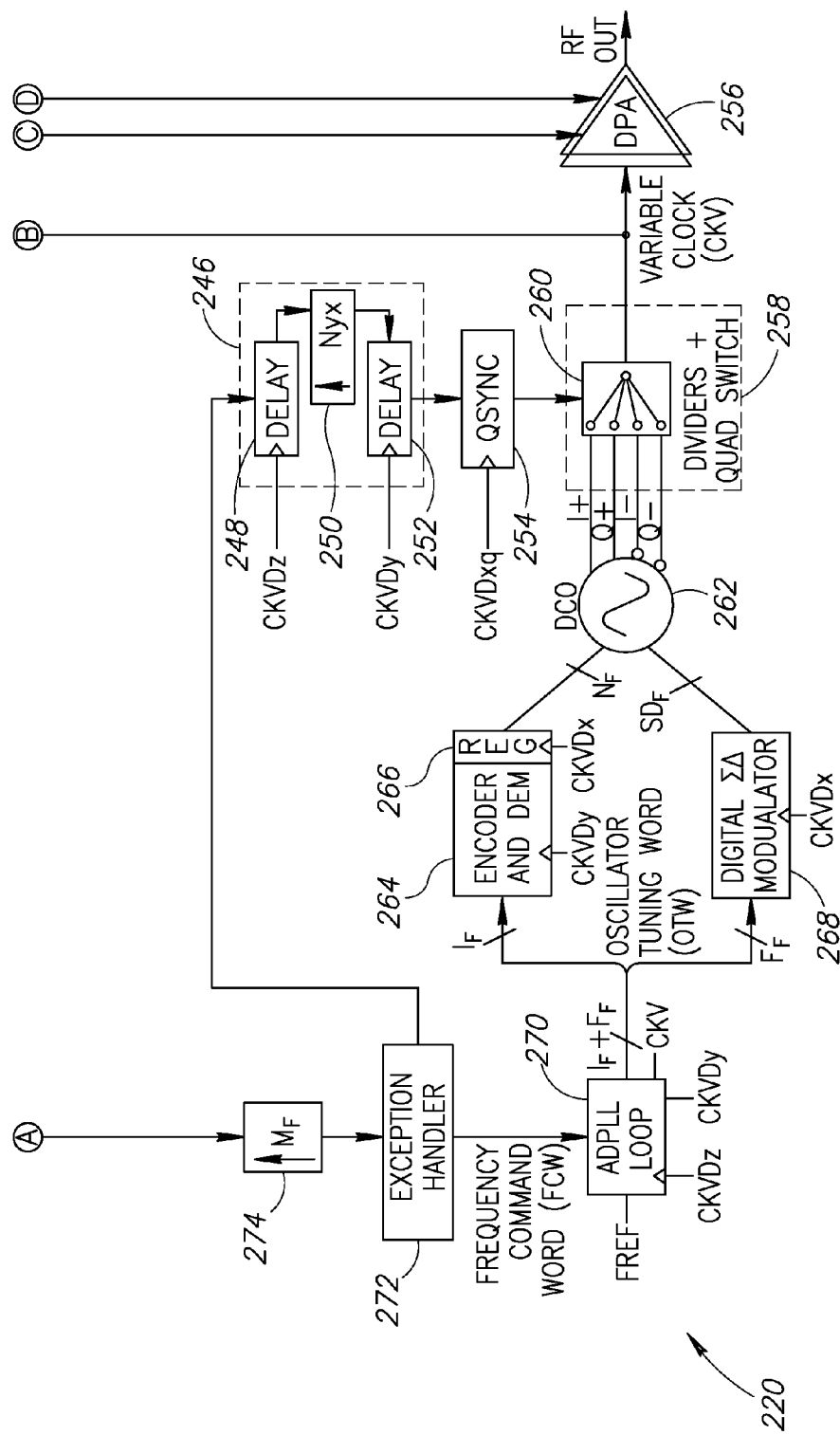

A block diagram illustrating a first embodiment of a WCDMA transmitter having precise delay alignment between amplitude and frequency modulation paths is shown in FIG. 17. The transmitter, generally referenced 220, comprises a pulse shaping filter 222, CORDIC and polar signal processing 224 which splits the data into amplitude and phase modulation paths. The amplitude modulation path comprises gain normalizer 224, AM-AM predistortion 226, digital delay adjustment 228, encoder and dynamic element matching (DEM) 230, digital $\Sigma\Delta$ modulator 234 and digital power amplifier (DPA) 256. The phase modulation path comprises AM-PM predistortion 276, phase interpolation 274, exception handler 272, ADPLL loop 270, encoder and DEM 264, digital $\Sigma\Delta$ modulator 268, DCO 262, quad switch 258, digital delay adjustment 246 and quad sync 254.

In accordance with the invention, the transmitter also comprises a clock divider array comprising divider chains 238, 240, 242. Clock divider chain 242 functions to divide the variable clock CKV output of the DCO by 1 or 2 to generate CKVDx, where x=1 or 2. Clock divider chain 240 functions to divide the CKVDx clock by 4 or 8 to generate CKVDy, where y=4 or 8. Clock divider chain 238 functions to divide the CKVDy clock by 4 or 8 to generate CKVDz, where z=16, 32 or higher. Tapped delay line (TDL) 244 (TDL1) delays CKVDx by a programmable amount to yield CKVDxq. Similarly, tapped delay line (TDL) 245 (TDL) delays CKVDx by a programmable amount to yield CKVDxa.

The WCDMA transmitter 220 provides precise delay alignment between frequency and amplitude modulation (both integer and fractional components) as well as for the quad switch based exception handling mechanism. Both the amplitude modulation path and the quad switch utilize the output of the tapped delay lines (TDL and TDL1) generated from the high speed clocks.

In this example embodiment, the digital delay adjustment blocks 228, 246 are both modeled after the delay adjustment block of FIG. 15. In both cases, the two clocks used for clk_lo and clk_hi are CKVDz and CKVDy, respectively. With reference to FIGS. 5 and 17, since these two clocks are derived from the same source (RF CKV clock in this case), the possibility of signal degradation due to estimation of the timing relationship between clocks is simplified. Furthermore, specific to a polar transmitter, the clock rate typically increases from the baseband I/Q input to the transmitter to the high-speed RF clock rate recombination of amplitude and phase. Therefore, as an example, in this case the circuit of FIG. 15 is utilized wherein the SRC is represented by a linear interpolation of the data rate from CKVDz to CKVDy clock domain.

The scheme described supra is used as an alignment and data handoff building block in FIG. 17 to create a fully digital delay alignment scheme. This digital delay adjustment block comprises a precisely known and predictable delay setting based on (1) the two clock rates chosen as CKVDz and CKVDy, (2) the number of flip-flops (FFs) employed in each clock domain and (3) the linear interpolation (sample rate conversion) scheme chosen for the data handoff.

FIG. 17 illustrates the block diagram of a WCDMA compliant polar transmitter using the hybrid polar/Cartesian transmit modulator, described in detail in U.S. Patent Publication No. 2006/0038710A1, cited supra. This hybrid architecture restricts the amount of phase modulation performed by the ADPLL to be less than ±45°. The sharper phase modulation transitions are handled by switching between the four quadrature phases out of the DCO. In the transmitter architecture of FIG. 17, the phase modulation output of the CORDIC is split using an exception handling block between the ADPLL and the quad-switch path. The exception handler functions to compute the delta phase in the CKVDz domain and then split it between the quad-switch and ADPLL in accordance with Table 1 presented below. The Quad Out in the table below is the control for the quad-switch, while the Phase Out is the phase modulation that is fed to the ADPLL as frequency modulation (FM).

TABLE 1

TX Exception Handling Scheme

| Delta Phase $P_{in}$ | Quad Out $Q_{out}$ 90 Deg = 1 Quadrant | Phase Out $P_{out}$ |
| --- | --- | --- |
| +45 to +135 | $Q_{out}$(prev) + 1 | $P_{in}$ − 90 deg |
| +135 to +225 | $Q_{out}$(prev) + 2 | $P_{in}$ − 180 deg |
| −45 to −135 | $Q_{out}$(prev) − 1 | $P_{in}$ + 90 deg |
| −45 to +45 | $Q_{out}$(prev) | $P_{in}$ |

For the polar transmitter incorporating exception handling as in FIG. 17, modulation accuracy for complex wide modulation bandwidth standards such as WCDMA, BT-EDR, 4G, etc., in terms of EVM, ACLRs and far-out noise, etc. is achieved by providing precise delay alignment between (1) the phase modulation path in ADPLL, (2) the switching control of quadrature modulated DCO phases and (3) the amplitude path. Note that the signal processing performed on the amplitude and phase modulation paths is asymmetric and the digital delay adjust blocks are therefore tuned to achieve the requisite delay alignment between all the modulation paths by accounting for the digital group delay of each digital signal processing block within each path.

Furthermore, very precise nanosecond range delay is achieved by ensuring that for both the amplitude and phase, integer and fraction components are aligned in the high-speed CKVDx clock domain. For example, consider the CKVDx clock is chosen to be the CKVD2 clock (approximately 1 GHz). In this case, the delay alignment accuracy between these different paths is less than 1 ns. To ensure such tight compliance, the mechanism of the invention provides the following:

First, CKVDx based registers 232, 266 are introduced as the clock domain for the final stage of registers on integer components of the AM and PM signals, respectively, which are otherwise handled in the CKVDy clock domain.

Second, the CKVDx clock used for this final set of registers can precisely be the same clock used for both AM and PM/FM paths. This mitigates the effects of possible independent clock tree delays in AM and PM/FM paths.

Third, alternately, the CKVDx clock used for amplitude and phase quad-switch paths; i.e. CKVDxa and CKVDxq, respectively; are adjusted for the physical analog delay in the DCO and divider tree and DPA, respectively, as described in more detail infra.

High Speed Clock Alignment Using Buffer Delays

Figure 18:
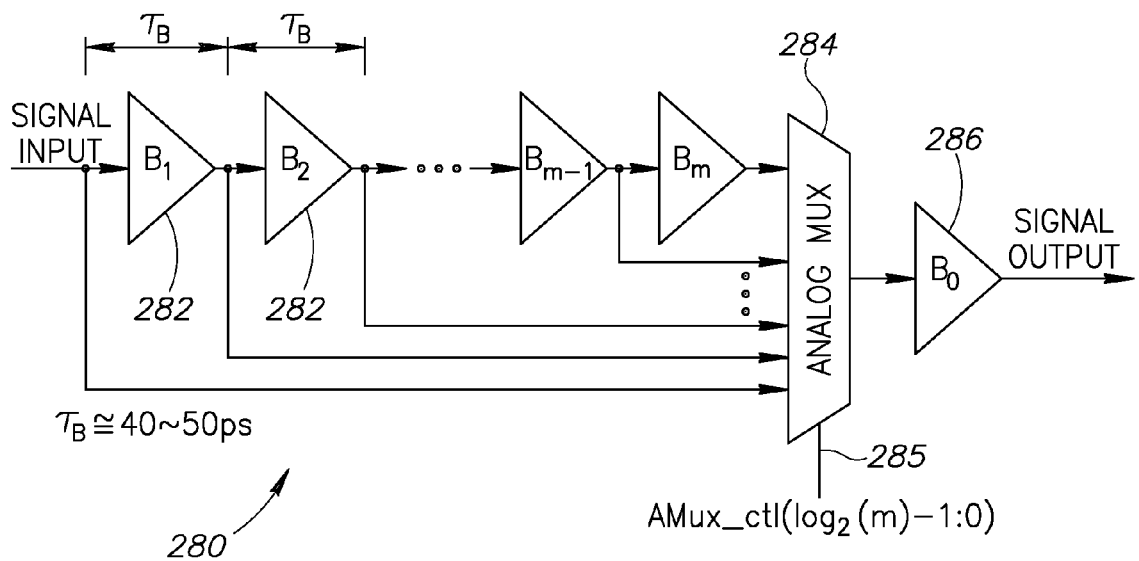
FIG. 18 is a block diagram illustrating a tapped delay line in accordance with the present invention.

In order to adjust the phase relationship between the highest speed clocks used in each path, a set of buffer delays are used to achieve very fine adjustment in picoseconds. A block diagram illustrating a tapped delay line in accordance with the present invention is shown in FIG. 18. The tapped delay line (TDL), generally referenced 280, comprises a plurality of m buffers 282, each having a buffer delay of $\tau_B$ (40 to 50 ps in this example), followed by an analog multiplexer 284 which is digitally controlled using the AMUX_CTL 285 digital (memory) register. The buffer $B_0$ 286 is a fixed buffer which is operative to ensure that the TDL delay is not skewed due to excessive loading on the switchable buffers. The number of buffers effectively placed in the TDL is selected by setting the digital control word AMUX_CTL to the appropriate value.

For the polar transmitter incorporating an exception handling mechanism, a TDL, such as shown in FIG. 18, is used to compensate for the analog propagation and settling delays in DCO, dividers, quad switch, buffers, level shifters and DPA circuits. Each step in the tapped delay line comprises a single buffer delay which is digitally controlled. This permits finer than CKV (i.e. sub-nanosecond) delay alignment between the all the constituent modulation paths.

The circuit of FIG. 17 shows one example embodiment in which separate TDLs are introduced for the adjustment of the analog delay between the CKVDx clock used for the ADPLL amplitude fractional modulation (i.e. CKVDxa) and the CKVDx clock used for amplitude and phase quad-switch paths, i.e. CKVDxq. The adjustment between CKVDx and CKVDxq functions to compensate for the analog propagation delay in the DCO due to the Q of the LC tank, which determines the propagation delay once additional varactors are either switched in or removed from the tank. The DCO clock is followed by a plurality of clock dividers to divide the DCO clock running on a multiple of the channel frequency down to the High Band (HB) or Low Band (LB, where LB=HB/2) clock rate. These clock dividers have a response time which depends on their topology, the threshold set by the circuit biasing etc.

Note that both the delays described above are functions of process, voltage and temperature (PVT). Consequently, the adjustment in CKVDxa is made to maximize the power added efficiency in the DPA. This is achieved by ensuring that the DCO phase modulated clock fed to the DPA is correctly aligned to the amplitude modulation data fed to the DPA, which controls the number of devices enabled in the DPA. The operation of a digital RF to amplitude converter suitable for use with the present invention is described in more detail in U.S. Patent Publication No. US2005/0287967, published Dec. 29, 2005, to Hung et al., entitled "Low Noise High Isolation Transmit Buffer Gain Control Mechanism," incorporated herein by reference in its entirety.

As described supra, one or more TDLs are used to account for mostly analog propagation delays, which are a function of PVT and frequency. Optionally, a calibration scheme incorporating a memory look-up table (LUT) is used to adjust the TDL delays based on the on-chip temperature and voltage monitors.

Figure 19A:
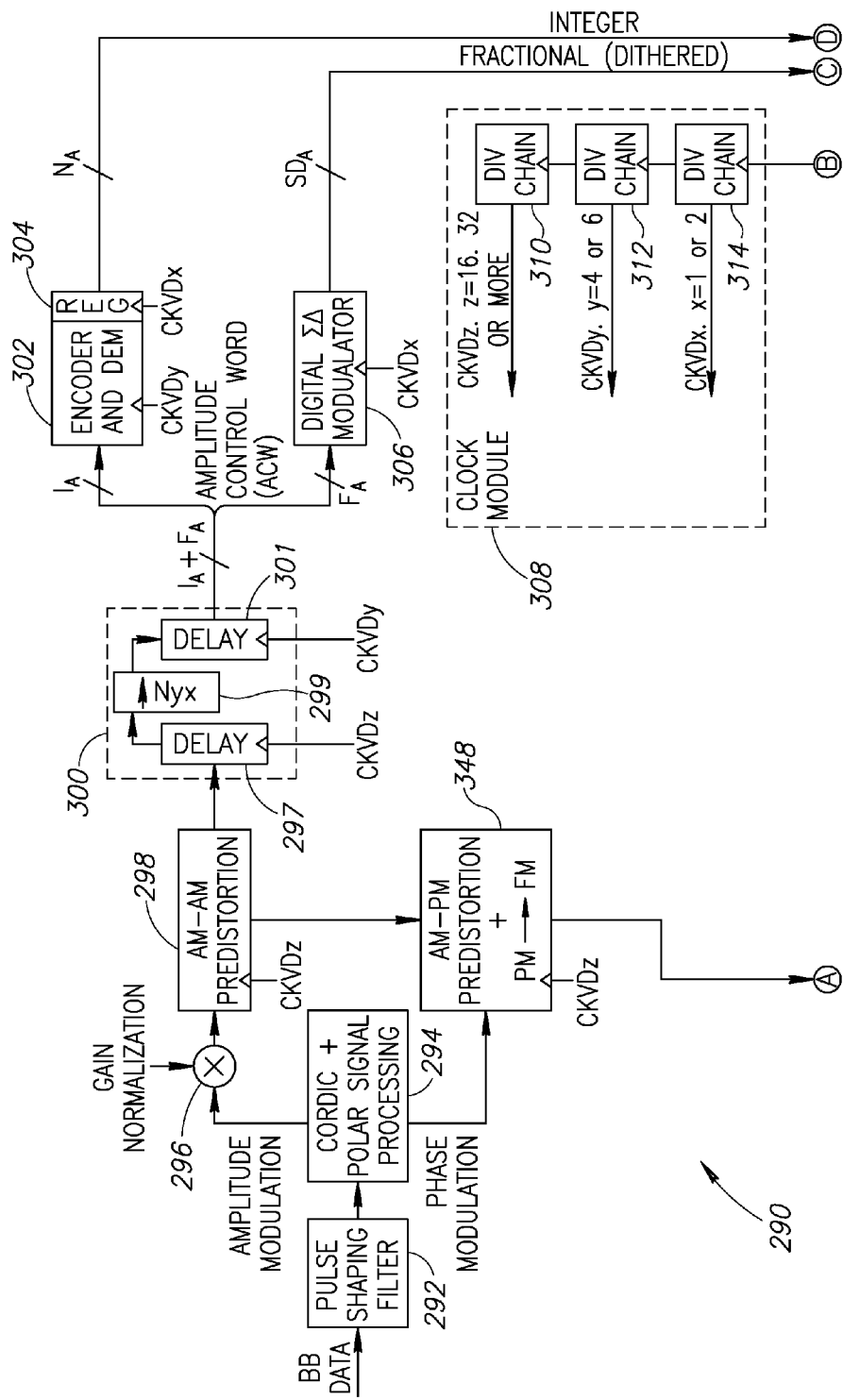
FIG. 19 is a block diagram illustrating a second embodiment of a WCDMA transmitter having precise delay alignment between frequency and amplitude modulation.
Figure 19B:
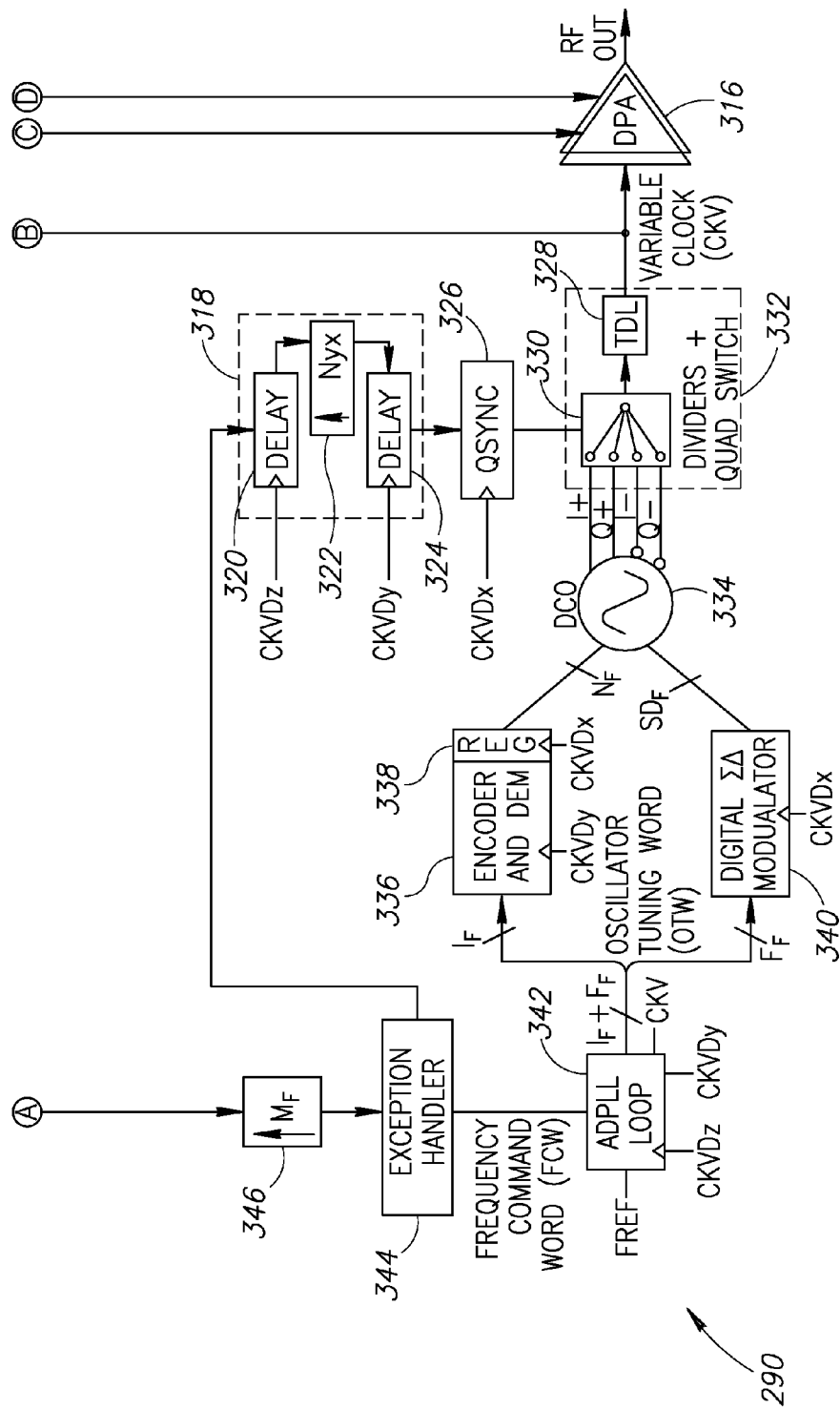

A block diagram illustrating a second embodiment of a WCDMA transmitter having precise delay alignment between amplitude and frequency modulation paths is shown in FIG. 19. The transmitter, generally referenced 290, comprises a pulse shaping filter 292, CORDIC and polar signal processing 294 which splits the data into amplitude and phase modulation paths. The amplitude modulation path comprises gain normalizer 296, AM-AM predistortion 298, digital delay adjustment 300, encoder and dynamic element matching (DEM) 302, digital $\Sigma\Delta$ modulator 306 and digital power amplifier (DPA) 316. The phase modulation path comprises AM-PM predistortion 348, phase interpolation 346, exception handler 344, ADPLL loop 342, encoder and DEM 336, digital $\Sigma\Delta$ modulator 340, DCO 334, quad switch 332 comprising TDL 328, digital delay adjustment 318 and quad sync 326.

In accordance with the invention, the transmitter also comprises a clock divider array comprising divider chains 314, 312, 310. Clock divider chain 314 functions to divide the variable clock CKV output of the DCO by 1 or 2 to generate CKVDx, where x=1 or 2. Clock divider chain 312 functions to divide the CKVDx clock by 4 or 8 to generate CKVDy, where y=4 or 8. Clock divider chain 310 functions to divide the CKVDy clock by 4 or 8 to generate CKVDz, where z=16, 32 or higher.

In this second embodiment, the TDL 328 is placed between the DCO 334 and the DPA 316. It is assumed that the analog propagation delay between the ADPLL modulation and the quad-switch is negligible. The purpose of the TDL in this scheme is to mainly maximize the PAE in the DPA.

Precise Alignment of Multi-Rate Direct and Reference Point Data Modulation Injection in ADPLL The all-digital phase-locked loop (ADPLL) of the digital radio-frequency processor (DRP) is described supra and in the references cited. The stringent modulation mask and spectral compliance requirements of 2.5G (EDGE)/3G (WCDMA) and beyond impose requirements that dictate the CORDIC rate in a polar transmitter. Further, in order to minimize the spectral re-growth due to the spectral replicas, the modulation injection occurs at a significantly higher rate as compared to the reference frequency clock used for the PLL. Running the ADPLL at a rate higher than the reference clock rate, however, is wasteful as the variable phase/frequency feedback happens at the rate of retimed reference or CKR. Both these modulation injection points must well aligned for desired ADPLL operation. To better understand the evolution of the ADPLL architecture to support the wider bandwidth phase/frequency modulation injection into the ADPLL below, three generations of ADPLL are described with respect to the modulation path.

In the ADPLL, the frequency reference (FREF) clock contains the only reference timing information for the RF frequency synthesizer to which phase and frequency of the RF output are to be synchronized. The RF variable output frequency $f_V$ is related to the reference frequency $f_R$ according to the following formula.

$$f_V = N \cdot f_R \qquad (3)$$

where, N≡FCW is real valued. The FREF source has excellent long term accuracy and stability, as compared to the variable RF oscillator.

Figure 20:
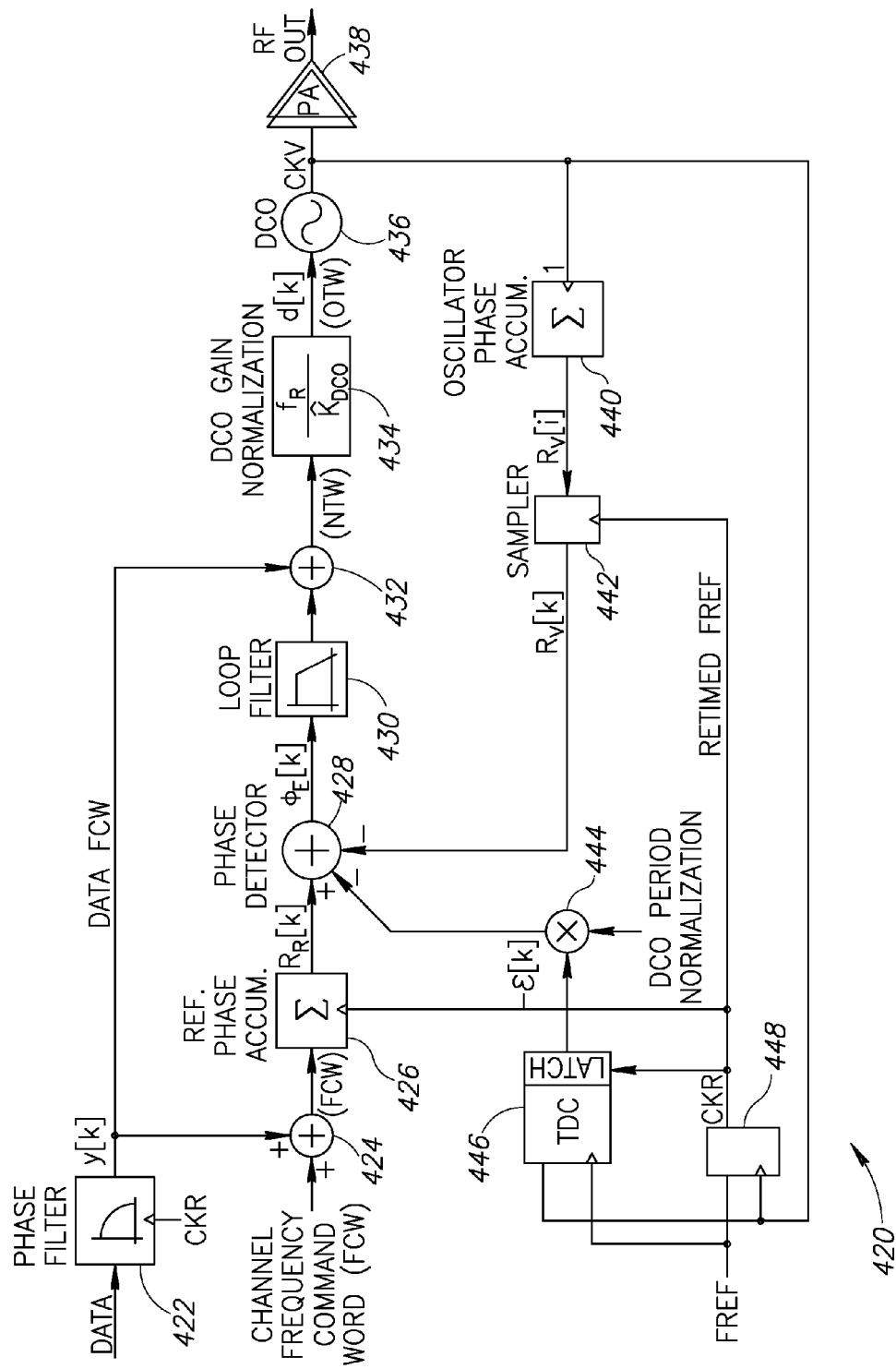
FIG. 20 is a block diagram illustrating a first generation ADPLL based DRP transmitter.

A DRP transmitter based on an all-digital PLL (ADPLL) with a wideband frequency modulation capability is shown in FIG. 20. The ADPLL, generally referenced 420, comprises complex pulse shaping filter 422, digital pre-power amplifier 438, adders 424, 432, phase detector 428, reference phase accumulator 426, loop filter 430, DCO gain normalizer 434, DCO 436, variable phase accumulator 440, sampler 442, FREF retimer 448, TDC 446 and TDC DCO-period normalizer 444.

The digitally-controlled oscillator (DCO) 436 produces a digital clock CKV in the RF frequency band. In the feedforward path, the CKV clock toggles an NMOS transistor switch of the near class-E RF digital power amplifier (DPA) 438 that is followed by a matching network (MN), and then terminated with a front-end module (FEM). In the feedback path, the CKV clock is used to retime the FREF clock. The FREF retiming quantization error is determined by the time-to-digital converter (TDC) 446, which is constructed as an array of inverter delay elements and registers, in order to compensate the quantization error by the system. The above operation strips FREF of its critical timing information and produces a retimed clock CKR that is subsequently used throughout the system. The CKR edge timestamps are now synchronous to the RF oscillator, in which time separation between the closest CKR and CKV edges is time invariant. In this embodiment, it is beneficial to avoid injection pulling, whereby the slowly varying timing separation between CKR and CKV causes the oscillator to be pulled, thus creating a frequency beating event that exhibits itself as spurs in the generated output.

First Generation DRP Phase Modulation

Figure 21:
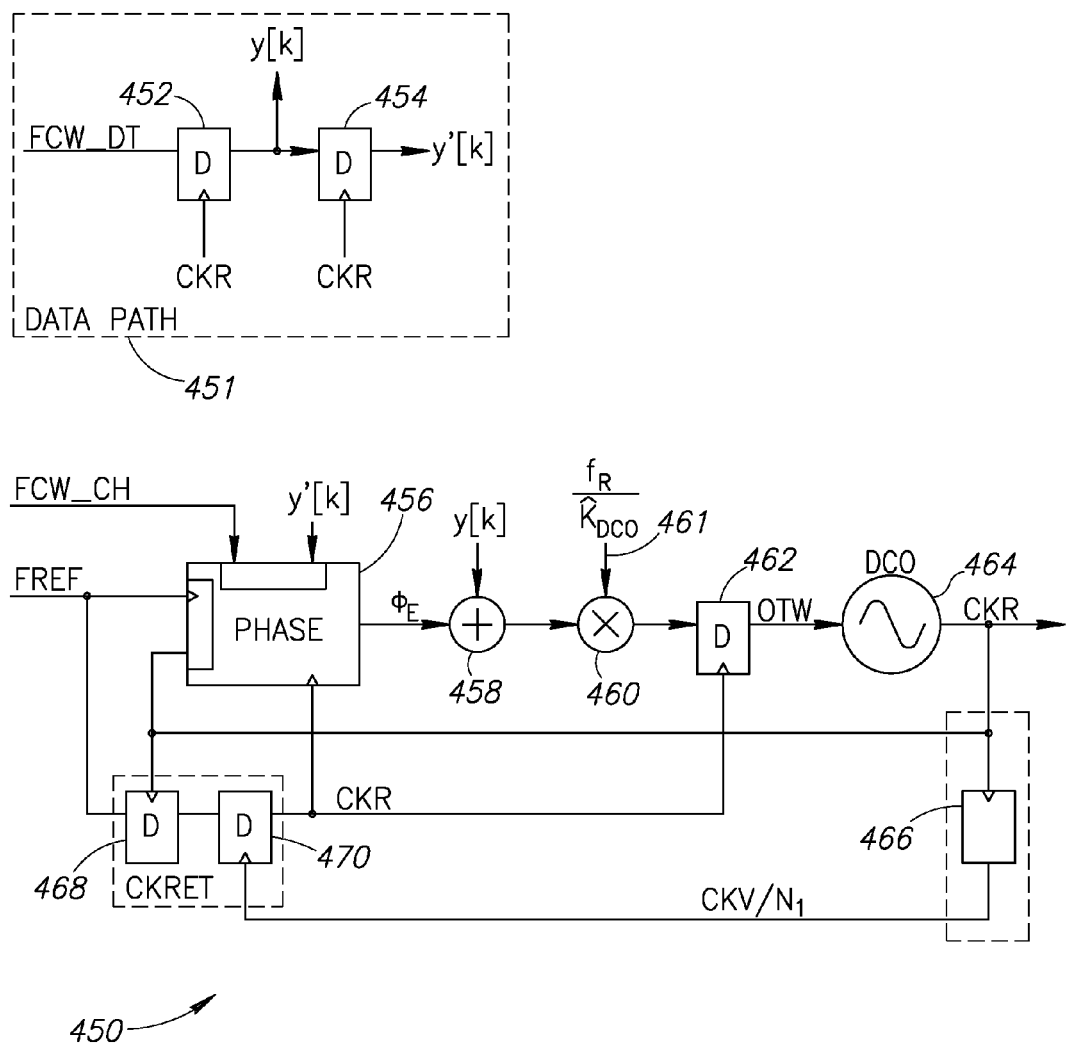
FIG. 21 is a block diagram illustrating the phase modulation path in a first generation ADPLL based DRP transmitter.

A block diagram illustrating the phase modulation path in a first generation ADPLL based DRP transmitter is shown in FIG. 21. The circuit, generally referenced 450, highlights the phase/frequency modulation path in the first generation DRP of FIG. 20, which targets the Bluetooth wireless standard for short-range wireless communications. In order to ease timing in actual interfaces between the FREF, CKR and CKVD clock domains, the FREF clock retiming circuitry further performs retiming by the CKV/$N_1$ clock, where typically $N_1$=8.

The circuit 450 illustrates the baseband transmit data path 451 (comprising registers 452, 454 and wherein FCW_DT is the modulation data frequency command word) and the ADPLL loop, comprising phase accumulator/detector 456, adder 458, gain normalization 460, registers 470, 468, 462, clock divider 466 and DCO 464.

The circuit 450 highlights the phase/frequency modulation path in the first embodiment DRP of FIG. 20. In order to ease timing in actual interfaces between the FREF, CKR and CKVD clock domains, the FREF clock retiming circuitry further performs retiming by the CKV/$N_1$ clock, where $N_1$=8 is implemented.

Several key features of the architecture include the following. First, the ADPLL phase operation and the entire PM modulation are performed on the CKR clock. Second, the phase error samples $\phi_E$ and the FCW-normalized modulating data samples y[k] of the feed-forward branch are merged before the tuning word computation. Third, to the extent of the DCO support of high frequency deviations and correct DCO gain estimation, $K_{DCO}$, the modulating path bandwidth is flat from DC to $f_R/2$. Fourth, the DCO gain multiplier, $f_R/\hat{K}_{DCO}$, controls both the modulation index m=$2\Delta f_{pk} \cdot T_s$ and the PLL bandwidth. For GSM, m=0.5 and $\hat{K}_{DCO}$ must be estimated precisely.

Second Generation DRP Phase Modulation

Figure 22:
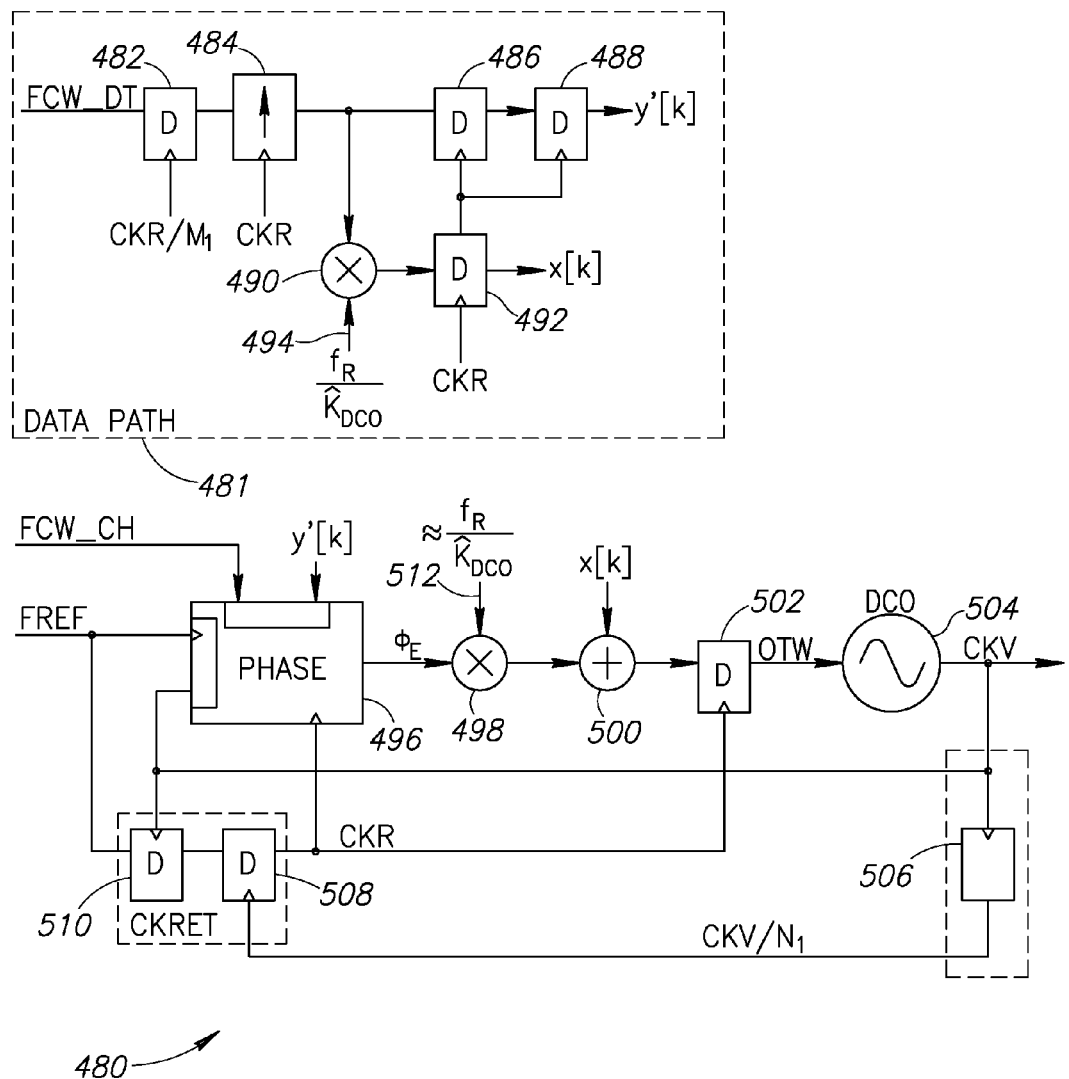
FIG. 22 is a block diagram illustrating the phase modulation path in a second generation ADPLL based DRP transmitter.

A block diagram illustrating the phase/frequency modulation path in a second generation ADPLL based DRP transmitter which targets the GSM standard is shown in FIG. 22. The circuit 480 illustrates the baseband data or modulation path 481 and ADPLL loop. The modulation path comprises source output register 482, delay registers 486, 488, 492, re-sampler or rate change converter 484 and gain normalizer 490 wherein FCW_DT is the modulation data frequency command word. The ADPLL loop comprises phase accumulator/detector system 496, gain normalization 498, adder 500, register 502, retiming registers 510, 508, clock edge divider 506 and DCO 504. This Figure illustrates the phase/frequency modulation path in the second generation DRP (i.e. second embodiment), which targets the GSM standard. In the GSM standard, the output of the pulse shaping filter is proportional to the frequency deviation and no conversion to the phase-proportional signal is explicitly required.

Several key features of the architecture of the second embodiment as described below. First, the ADPLL phase operation and the PM modulation are performed on the CKR clock. In order to reduce circuit complexity and save dissipated power, the pulse-shaping filter at the front-end of the modulating path can operate at a lower CKR/$M_1$ rate, where $M_1$ is an integer, followed by the CKR-rate upsampler.

Second, the tuning word samples and the DCO-normalized modulating data samples x[k] of the feed-forward branch are merged before the final CKR-clocked flip-flop 502 of the DCO interface.

Third, to the extent of the DCO support of high frequency deviations and correct DCO gain estimation, $K_{DCO}$, the modulating path bandwidth is flat from DC to $f_R/2$.

Fourth, the DCO gain multiplier, $f_R/K_{DCO}$ now appears independently in two places. Only the modulating path multiplier $f_R/K_{DCO}$, which controls the modulation index, is required to be configured precisely. The ADPLL loop multiplier needs only to be accurate to the extent of the desired accuracy of the PLL bandwidth.

Third Generation DRP Phase Modulation

Figure 23:
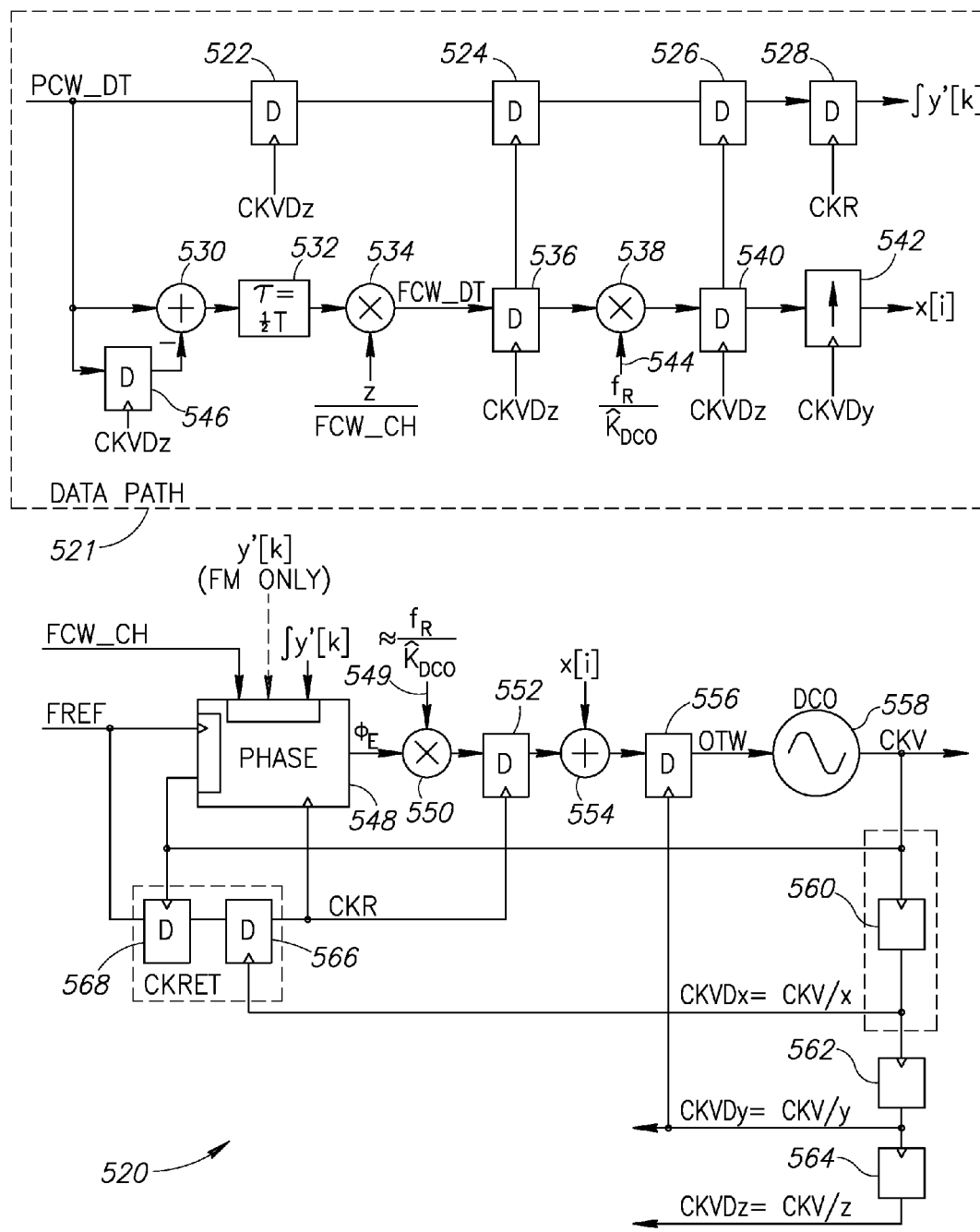
FIG. 23 is a block diagram illustrating the phase modulation path in a third generation ADPLL based DRP transmitter.

A block diagram illustrating the phase/frequency modulation path in a third generation ADPLL based DRP transmitter is shown in FIG. 23. The baseband multi-data rate data path 521 comprises adder 530, delay registers 546, 522, 524, 526, 528, 536, 540, re-sampler or data rate converter 542 and multiplier 534 and gain normalization 538 for full bit multiplying the data by a high precision modulation path multiplier 544. The ADPLL loop 520 comprises phase accumulator/detector system 548, loop gain normalization 550 for multiplying a low precision loop multiplier 549, adder 554, registers 552, 556, clock edge dividers 560, 562, 564, frequency reference re-sampling registers 568, 566 and DCO 558.

The Figure illustrates the phase/frequency modulation path in the third generation DRP (i.e. third embodiment). It adds support for the high data rates of the WCDMA and WLAN standards by dramatically increasing the frequency modulating bandwidth. The maximum bandwidth limitation of $f_R/2$ in DRP1 and DRP2 architectures is broken here by employing CKV-down-divided clocks in the final stages of the modulating path. Since the modulating sample rate is much higher now than the CKR clock, the modulating stream is merged with the ADPLL phase/frequency corrections just before the DCO input.

The key features of the architecture are described below. First, the ADPLL phase operation is performed on the CKR clock. Second, in order to reduce circuit complexity and save dissipated power, the pulse-shaping filter at the front-end of the modulating path operates at the lower CKVDz rate, where z is an integer. The FCW-normalized samples are then resampled to the CKR rate for the y'[k] compensating path. The FCW-normalized samples are also converted to the tuning word format and then upconverted to the CKVDy rate for the feedforward x[i] path, where y is also an integer factor such that y<z.

Third, the tuning word samples and the DCO-normalized modulating data samples x[i] of the feed-forward branch are merged on the high-speed CKVDy interface. Fourth, the PM modulating path is synchronous to the CKV clock, by entirely operating on the CKV integer divisions. Fifth, this architecture is intended mainly for frequencies of CKVDy>CKR. To the extent of the DCO support of high frequency deviations, the modulating path can be made arbitrarily wide, from DC to CKVDy. Sixth, being synchronous to the CKV clock, the pulse-shaping filter (PSF) clock rate is now based on a modulated channel dependent clock after a fractional N division to ensure correct operation. The output of the PSF is then upsampled in an interpolative manner to achieve the desired spectral and modulation accuracy required at the DRP based transmitter output.

Seventh, as in the second generation DRP2, the DCO gain multiplier $f_R/\hat{K}_{DCO}$ is split between the modulation path and the PLL loop, wherein $f_R/K_{DCO}$ appears independently in two places. Only the modulating path multiplier $f_R/K_{DCO}$ which controls the modulation index, needs to be set precisely. The ADPLL loop multiplier needs only to be accurate to the extent of the desired accuracy of the PLL bandwidth. In case a precise loop bandwidth across the operational range of the transmitter is required, the ADPLL loop multiplier $f_R/K_{DCO}$ must be made accurate as well.

Reference and Direct Modulation Point Injection Alignment

Figure 24:
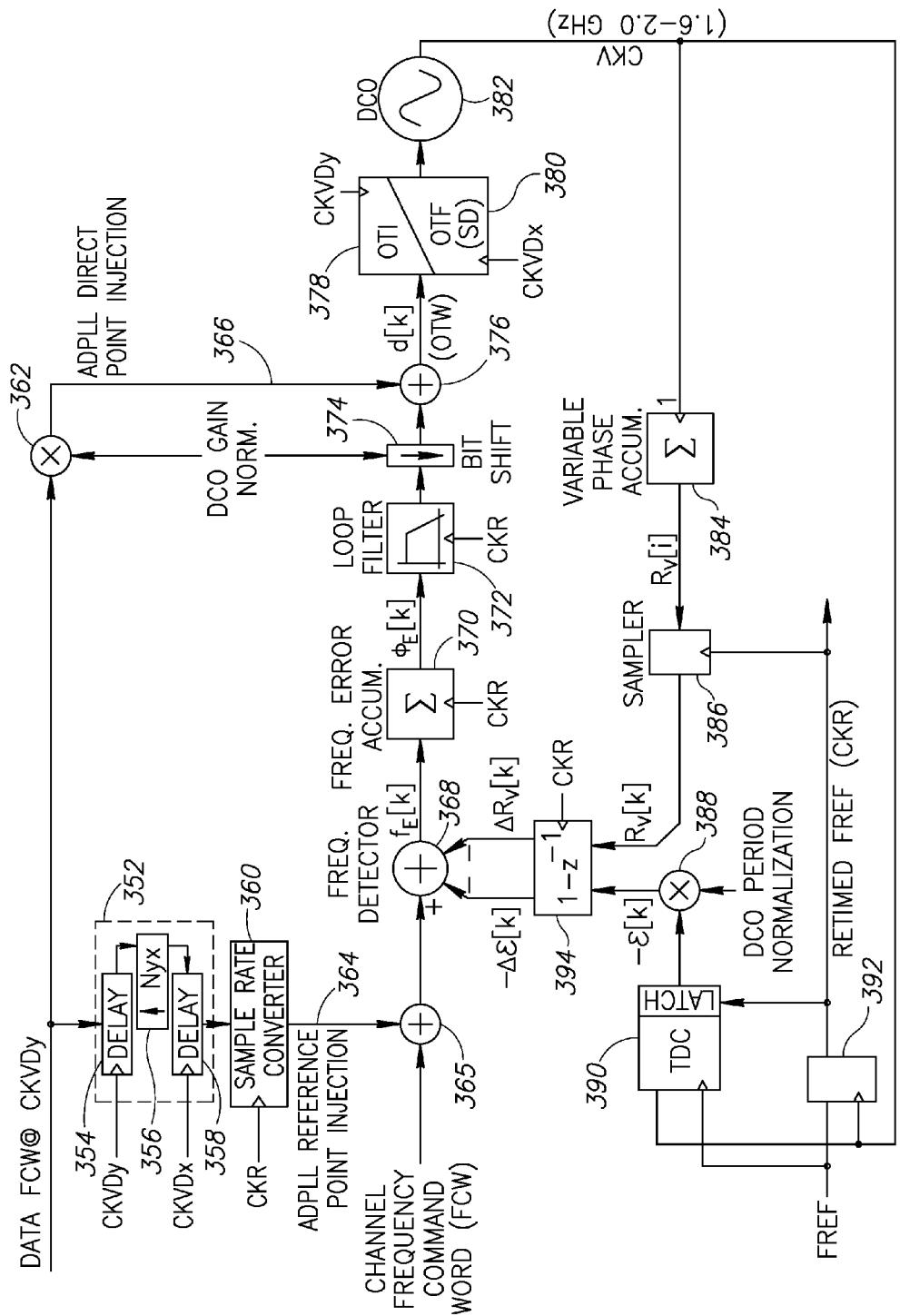
FIG. 24 is a block diagram illustrating an ADPLL with direct point injection and reference point injection rates of different clock domains.

A block diagram illustrating an ADPLL with direct point injection and reference point injection rates of different clock domains is shown in FIG. 24. The ADPLL circuit, generally referenced 350, is the third generation of ADPLL as described using the digital delay adjust (DDA) block of FIG. 15. The ADPLL 350 comprises digital delay adjust block 352, sample rate converter 360, adders 365, 376, frequency detector 368, frequency error accumulator 370, loop filter 372, multiple bit shift 374, DCO gain normalizer 362, integer oscillator tuning (OTI) block 378, fractional oscillator tuning (OTF) block 380, DCO 382, variable phase accumulator 384, sampler 386, FREF retimer 392, TDC 390, variable phase differentiator 394 and TDC DCO-period normalizer 388.

Due to the higher phase modulation accuracy required of an EDGE, WCDMA or 4G transmitter, the direct point injection operates off the CKVDy clock while the reference point injection occurs at the retimed FREF clock rate (CKR). The alignment of these two paths for correct frequency/phase error computation needs to be achieved in the CKR domain. In accordance with the present invention, the use of an interpolative correlation technique allows for the precise tuning of CKVDy and CKVDx delays in the direct point injection to achieve the required alignment.

The direct point injection of modulation data into the PLL directly modulates the DCO at the CKVDy rate. The DCO in turn feeds the phase modulated clock to the DPA as well as feeds it back into the ADPLL loop. Cancellation of the modulated feedback is required in order to avoid the PLL loop from responding to the transient modulation effects. Without the reference feed cancellation, the PLL loop would not be sufficiently stable to meet the required phase noise performance. In the absence of proper modulation cancellation, the computed frequency error can have large spikes which can cause the ADPLL loop to chatter. Proper delay matching is thus a requisite for proper two-point closed loop modulation without degradation of the ADPLL phase domain performance. Thus, the ADPLL loop maintains the proper center frequency by exact cancellation of two modulation injections to the loop.

Reference point modulation injection in the closed loop PLL takes place at the phase frequency detector 368 at the CKR rate, where the difference between reference frequency control word (FCW) and the feedback frequency data (obtained by the differentiation of variable clock phase with respect to FREF) is computed. While the direct modulation signal is fed back through the ADPLL feedback loop (which comprises accumulator 384 and time-to-digital converter (TDC) 390) with some propagation delay, the reference FCW signal that carries the same modulation information in the CKR clock domain must be properly aligned in time in order to yield zero phase/frequency error. Note the DCO interface block receives the fixed point oscillator tuning word (OTW) with the integer and fractional portions split between OTI 378 and OTF 380 blocks, respectively. The OTI operates on the CKVDy clock while the OTF comprises a sigma-delta modulator that operates on the high speed CKVDx clock. Note that the OTI and OTF blocks comprise the same frequency modulation integer and fraction blocks as shown in FIGS. 17 and 19.

In accordance with the invention, the required alignment is achieved in two stages: one being the result of mathematical and digital analysis which provides a starting point for delay matching and the second being performing mathematical correlation between the reference and feedback signals so as to provide quantitative results on the magnitude of the delay mismatch. The first step results in obtaining a register level manual delay alignment which brings the signals into coarse delay alignment.

To ensure proper delay alignment is achieved, the mechanism of the invention comprises signal correlative measures wherein data from the two paths to be matched is first interpolated and then cross-correlated to achieve accuracy better than the clock domain of comparison. In particular, this is critical for the precise alignment of ADPLL reference and direct point injection points. The time resolution of the magnitude of the correlative mismatch is selected using interpolative measures to determine practical matching needed in CKR, CKVDx and CKVDy clock domains, respectively.

The unbiased cross correlation between two signals A and B is defined as $$c_{AB}(m) = \frac{1}{N-|m|} \cdot \begin{cases} \sum_{n=0}^{N-|m|-1} A_n \cdot B_{n+m}^*; & m \geq 0 \\ c_{AB}^*(-m); & m < 0 \end{cases} \quad (4)$$

where $A_n$ and $B_n$ are two stationary random signal processes of vector length N. A maximum of the cross-correlation $c_{AB}(m)$ corresponds to the lag m, at which the two signals have the highest correlations. In case $A_n$ and $B_n$ are two versions of the same signal, this corresponds to the determination of the temporal delay between the respective observation points of signals A and B.

In this particular case, the mechanism is operative to perform correlation between a reference and the test signal at a meaningful time resolution, in particular, one that aligns with one of the tunable clock domains. The absolute time delay for each signal from start point to end point is computed by computing the cross correlation with the reference signal as start point and the test signal as the end point.

Once the absolute time delay for each path is known, each path is individually delay matched to the time resolution available in the corresponding path, namely CKVDx, CKVDy and CKR time domains.

In order to appropriately tune the delay elements using the available clock domains, the cross-correlation is carried out starting from the coarsest time delay. After correlation, the result is truncated (floored), and the appropriate delay elements are set first in the coarsest clock domain. This is carried out in steps up to the finest clock domain available in the individual path ensuring good absolute delay alignment. This minimizes the overall need for digital registers typically needed for such alignment and also reduces the overall power consumption of the circuit.

In the second correlation step, for better tuning resolution after the multi-clock cycle based delay alignment outlined above, the cross correlation computation is carried out again in the highly oversampled signal domain, e.g., CKVDx. The result of this correlation step is used to adjust the final relative delay between the two signals paths, e.g., the direct and reference point injection points using the CKVDx clock domain.

Optionally, the precise sub-CKR clock period alignment within the direct and the reference point modulation injection within the ADPLL can be determined using built-in-self test (BIST) techniques using PHE as the quality monitor. A misalignment between the two paths causes a noticeable degradation in the PLL phase error signal. Further, the mechanism can also be dynamically adapted using the available script processor or any other available on-chip computational resource.

Figure 25A:
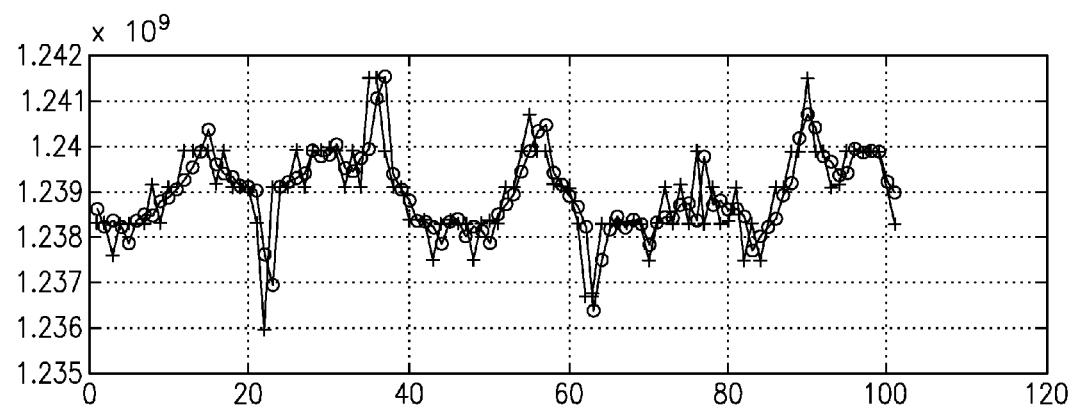
FIG. 25A is a graph illustrating the use of multi-rate correlation determined using analytic clock alignment for the alignment of direct and reference point injections.
Figure 25B:
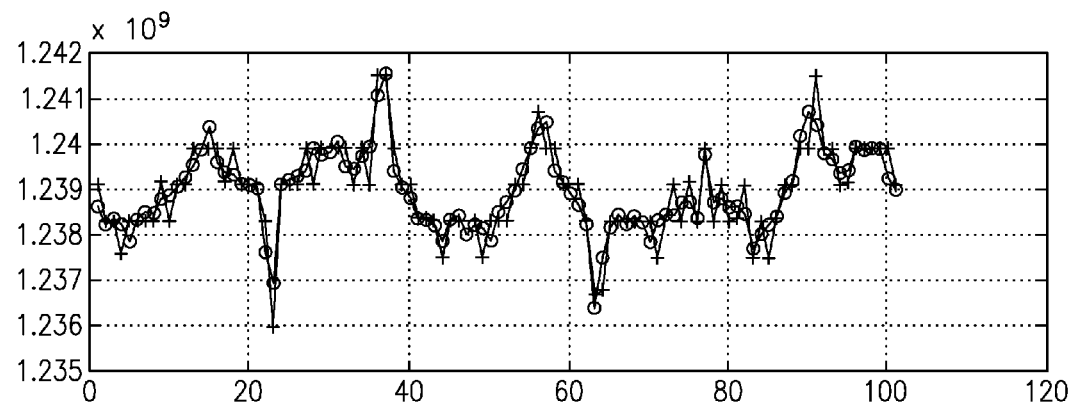
FIG. 25B is a graph illustrating the use of multi-rate correlation determined using correlative measures to tune multiple clock domain delays for the alignment of direct and reference point injections.

A graph illustrating the use of multi-rate correlation determined using analytic clock alignment for the alignment of direct and reference point injections is shown in FIG. 25A. A graph illustrating the use of multi-rate correlation determined using correlative measures to tune multiple clock domain delays for the alignment of direct and reference point injections is shown in FIG. 25B.

Use of the mechanism of the present invention results in approximately 20% improved root mean square (RMS) phase error as well as 35% improvement in peak phase error performance of the ADPLL as compared to that achieved without the correlative optimization technique of the invention. It is important to note that the mechanism of the invention is capable of handling any unknown independent component of delay in one of the data paths as the respective transfer function group delay can be treated as a lumped component of the computed correlation function.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of time alignment of a signal split into a plurality of independent paths, said method comprising the steps of:
   determining processing delays within one or more modules adapted to process said independent signal paths;
   generating a plurality of clock domains;
   using programmable delay elements between said plurality of clock domains to delay one or more clock domains;
   distributing said plurality of clock domains and the output of said programmable delay elements so as to compensate for said processing delays; and
   calibrating the time alignment between said independent paths wherein said step of calibrating comprises:
      interpolating data from each said independent signal path to be matched;
      correlating interpolated data to generate a delay associated with each independent signal path; and
      matching each delay to available time resolution among said plurality of clock domains.

2. The method according to claim 1, wherein said programmable delay elements comprise a plurality of digitally controlled buffer delays.

3. A method of delay alignment between amplitude and phase/frequency modulation paths in a digital polar transmitter, said method comprising the steps of:
   dividing a local oscillator clock output into a plurality of clock domains;
   delaying one or more of said clock domains in time by an amount adapted to compensate for analog propagation and settling times in said amplitude and phase/frequency modulation paths; and
   applying said plurality of clock domains and said one or more delayed clock domains to circuit modules within said amplitude and phase/frequency modulation paths so as to provide time alignment between said amplitude and phase/frequency modulation paths.

4. The method according to claim 3, further comprising the step of calibrating time alignment between said amplitude and phase/frequency modulation paths.

5. The method according to claim 4, wherein said step of calibrating comprises the steps of:
   interpolating data from each said independent signal path to be matched;
   correlating interpolated data to generate a delay associated with each independent signal path; and
   matching each delay to available time resolution among said plurality of clock domains.

6. The method according to claim 3, wherein said step of delaying comprises the step of using programmable delay elements comprising a plurality of digitally controlled buffer delays.

7. The method according to claim 3, further comprising the step of delaying a quadrature switch signal by an amount adapted to compensate for time alignment mismatches within said transmitter.

8. An apparatus for providing delay alignment between amplitude and phase/frequency modulation paths in a digital polar transmitter, comprising:
   a clock module for dividing a local oscillator clock output into a plurality of clock domains;
   a tapped delay line operative to delay one or more of said clock domains by a programmable amount adapted to compensate for analog propagation and settling times in said amplitude and phase/frequency modulation paths; and
   means for applying said plurality of clock domains and said one or more delayed clock domains to circuit modules within said amplitude and phase/frequency modulation paths so as to provide time alignment between said amplitude and phase/frequency modulation paths.

9. The apparatus according to claim 8, further comprising a delay adjustment module operative to delay a quadrature switch signal by an amount adapted to compensate for time alignment mismatches within said transmitter.

10. The apparatus according to claim 9, wherein said delay adjustment module comprises:
    a first plurality of flip flops adapted to receive an input signal clocked by a first clock domain;
    an interpolator operative to interpolate the output of said first plurality of flip flops by a predetermined ratio; and
    a second plurality of flip flops adapted to receive the output of said interpolator and clocked by a second clock domain.

11. The apparatus according to claim 10, wherein said ratio comprises the ratio of said second clock domain to a third clock domain.

12. The apparatus according to claim 8, wherein final digital stages of both said amplitude and phase/frequency modulation paths share a common clock domain.

13. An apparatus for providing delay alignment between amplitude and phase/frequency modulation paths in a digital polar transmitter, comprising:
    a programmable tapped delay line operative to delay a local oscillator clock in accordance with a delay control signal;
    a clock module for dividing either the delayed or non delayed local oscillator clock output of said programmable tapped delay line into a plurality of clock domains; and
    means for applying said plurality of clock domains to circuit modules within said amplitude and phase/frequency modulation paths so as to provide time alignment between said amplitude and phase/frequency modulation paths.

14. An apparatus for providing delay alignment between amplitude and phase/frequency modulation paths in a digital polar transmitter, comprising:
    a clock divider module operative to generate a plurality of clock domains derived from the clock output of a digital controlled oscillator (DCO);
    means for assigning said plurality of clock domains to signal processing blocks within said amplitude and phase/frequency modulation paths;
    one or more digital delay adjustment modules operative to convert data within said amplitude and phase/frequency modulation paths from one clock domain to another; and
    a tapped delay operative comprising a plurality of buffer delays operative to adjust the phase relationship between high speed clock domains within said amplitude and phase/frequency modulation paths.

15. The apparatus according to claim 14, wherein each of said one or more digital delay adjustment module blocks comprises sample rate conversion means capable of being tuned to achieve desired delay alignment between said amplitude and phase/frequency modulation paths by accounting for the digital group delay of each said signal processing blocks within said amplitude and phase/frequency modulation paths.

16. The apparatus according to claim 14, wherein said tapped delay line is located between said DCO and a digital power amplifier (DPA).

17. The apparatus according to claim 14, wherein said tapped delay line is coupled to one or more clock domains output of said clock divider module.

18. The apparatus according to claim 14, wherein said tapped delay line is configured to compensate for analog propagation delays in one or more signal processing blocks within said amplitude and phase/frequency modulation paths.

19. The apparatus according to claim 14, wherein said digital delay adjustment module comprises:
   a first plurality of delay elements clocked at a first clock domain;
   a second plurality of delay elements clocked at a second clock domain; and
   a sample rate converter operative to convert between said first clock domain and said second clock domain.

20. The apparatus according to claim 19, wherein said sample rate converter is operative to perform interpolation when said first clock domain is slower than said second clock domain.

21. The apparatus according to claim 19, wherein said sample rate converter is operative to perform decimation when said first clock domain is faster than said second clock domain.

22. A polar transmitter comprising:
   an amplitude modulation path;
   a phase/frequency modulation path;
   said phase/frequency modulation path comprising a frequency synthesizer for performing a frequency modulation; said frequency synthesizer comprising a digitally controlled oscillator (DCO);
   delay alignment means said for providing delay alignment between said amplitude modulation path and said phase/frequency modulation path, said delay alignment means comprising:
   a clock module for dividing a DCO output signal into a plurality of clock domains;
   a tapped delay line operative to delay one or more of said clock domains by a programmable amount adapted to compensate for analog propagation and settling times in said amplitude and phase/frequency modulation paths; and
   means for applying said plurality of clock domains and said one or more delayed clock domains to circuit modules within said amplitude and phase/frequency modulation paths so as to provide time alignment between said amplitude and phase/frequency modulation paths.

* * * * *